US012628507B2

(12) United States Patent
Huang et al.

(10) Patent No.: US 12,628,507 B2
(45) Date of Patent: May 12, 2026

(54) DISPLAY SUBSTRATE WITH BOTTOM GATE ELECTRODES ARRANGED IN SAME LAYER, PREPARATION METHOD THEREOF, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Peng Huang, Beijing (CN); Tao Gao, Beijing (CN); Bingqiang Gui, Beijing (CN); Ke Yang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 1024 days.

(21) Appl. No.: 17/779,144

(22) PCT Filed: Jun. 23, 2021

(86) PCT No.: PCT/CN2021/101857
§ 371 (c)(1),
(2) Date: Dec. 29, 2022

(87) PCT Pub. No.: WO2022/266887
PCT Pub. Date: Dec. 29, 2022

(65) Prior Publication Data
US 2024/0172490 A1     May 23, 2024

(51) Int. Cl.
H10K 59/124     (2023.01)
H10K 59/12     (2023.01)
(Continued)

(52) U.S. Cl.
CPC ....... H10K 59/124 (2023.02); H10K 59/1201 (2023.02); H10K 59/126 (2023.02); H10K 2102/311 (2023.02)

(58) Field of Classification Search
CPC ............. H10K 59/124; H10K 59/1201; H10K 59/126; H10K 2102/311; H10K 59/1213; H10D 30/67; H10D 86/00
See application file for complete search history.

(56) References Cited

U.S. PATENT DOCUMENTS 10,141,387 B2    11/2018  Lius et al.
2017/0294497 A1*  10/2017  Lius ...................... H10D 86/40
(Continued)

FOREIGN PATENT DOCUMENTS

CN        107170829  A      9/2017
CN        108470717  A      8/2018
(Continued)

*Primary Examiner* — Jacob Y Choi
*Assistant Examiner* — Grace Cha
(74) *Attorney, Agent, or Firm* — Ling Wu; Stephen Yang; Ling and Yang Intellectual Property

(57) ABSTRACT
The present disclosure provides a display substrate, a preparation method thereof, and a display apparatus. The display substrate includes a base substrate and a drive structure layer disposed on the base substrate, wherein the drive structure layer includes a first transistor and a second transistor arranged side by side, the first transistor includes a low temperature poly silicon transistor, and the second transistor includes an oxide transistor; the first transistor includes a first bottom gate electrode simultaneously served as a shielding layer, the second transistor includes a second bottom gate electrode simultaneously served as a shielding layer, and the first bottom gate electrode and the second bottom gate electrode are arranged in a same layer.

16 Claims, 12 Drawing Sheets

(51) Int. Cl.
     *H10K 59/126*     (2023.01)
     *H10K 102/00*    (2023.01)

(56)              References Cited

U.S. PATENT DOCUMENTS

| | | | |
|---|---|---|---|
| 2018/0062105 A1* | 3/2018 | Lius | H10K 59/1216 |
| 2019/0131321 A1 | 5/2019 | Yuan | |
| 2019/0207037 A1 | 7/2019 | Wang et al. | |
| 2019/0339554 A1 | 11/2019 | Chen et al. | |
| 2019/0348449 A1* | 11/2019 | Gui | H10D 86/423 |
| 2020/0144309 A1 | 5/2020 | Jeon et al. | |
| 2020/0243566 A1 | 7/2020 | Liu | |
| 2021/0408192 A1 | 12/2021 | Zhang et al. | |
| 2022/0149137 A1 | 5/2022 | Wang et al. | |

FOREIGN PATENT DOCUMENTS

| | | |
|---|---|---|
| CN | 108761943 A | 11/2018 |
| CN | 109273404 A | 1/2019 |
| CN | 109326633 A | 2/2019 |
| CN | 110690232 A | 1/2020 |
| CN | 110993613 A | 4/2020 |
| CN | 111192884 A | 5/2020 |
| CN | 112366222 A | 2/2021 |

* cited by examiner

DISPLAY SUBSTRATE WITH BOTTOM GATE ELECTRODES ARRANGED IN SAME LAYER, PREPARATION METHOD THEREOF, AND DISPLAY APPARATUS

CROSS-REFERENCE TO RELATED APPLICATION

The present application is a U.S. National Phase Entry of International Application No. PCT/CN2021/101857 having an international filing date of Jun. 23, 2021. The entire contents of the above-identified application are hereby incorporated by reference.

TECHNICAL FIELD

The present disclosure relates to, but is not limited to, the field of display technologies, and particularly to a display substrate, a preparation method thereof, and a display apparatus.

BACKGROUND

An Organic Light Emitting Diode (OLED) is an active light emitting display device, which has advantages of auto-luminescence, a wide angle of view, a high contrast ratio, low power consumption, an extremely high response speed, lightness and thinness, bendability, a low cost, etc. With constant development of display technologies, a flexible display apparatus (Flexible Display) using an OLED as a light emitting device and performing signal control by using a Thin Film Transistor (TFT for short) has become a mainstream product in the field of display at present.

SUMMARY

The following is a summary about subject matters described in the present disclosure in detail. The summary is not intended to limit a scope of protection of claims.

In one aspect, the present disclosure provides a display substrate including a base substrate and a drive structure layer disposed on the base substrate, wherein the drive structure layer includes a first transistor and a second transistor arranged side by side, the first transistor includes a low temperature poly silicon transistor, and the second transistor includes an oxide transistor; the first transistor includes a first bottom gate electrode simultaneously served as a shielding layer, the second transistor includes a second bottom gate electrode simultaneously served as a shielding layer, and the first bottom gate electrode and the second bottom gate electrode are arranged in a same layer.

In an exemplary implementation mode, the drive structure layer includes a first conductive layer disposed on the base substrate, an active structure layer disposed on a side of the first conductive layer away from the base substrate, and a source drain structure layer disposed on a side of the active structure layer away from the base substrate; the first conductive layer includes the first bottom gate electrode and the second bottom gate electrode arranged in the same layer In an exemplary implementation mode, the active structure layer includes: a first insulation layer covering the first conductive layer, a first active layer of the first transistor disposed on a side of the first insulation layer away from the base substrate, a second insulation layer covering the first active layer, a first top gate electrode of the first transistor disposed on a side of the second insulation layer away from the base substrate, a second active layer of the second transistor disposed on a side of the second insulation layer away from the base substrate, a third insulation layer covering the first gate top electrode and the second active layer, and a second top gate electrode of the second transistor disposed on a side of the third insulation layer away from the base substrate.

In an exemplary implementation mode, the active structure layer includes: a first insulation layer covering the first conductive layer, a first active layer of the first transistor disposed on a side of the first insulation layer away from the base substrate, a second insulation layer covering the first active layer, a second active layer of the second transistor disposed on a side of the second insulation layer away from the base substrate, a third insulation layer covering the second active layer, and a first top gate electrode of the first transistor and a second top gate electrode of the second transistor disposed on a side of the third insulation layer away from the base substrate; the first top gate electrode and the second top gate electrode are arranged in a same layer.

In an exemplary implementation mode, the source drain structure layer includes: a fourth insulation layer disposed on a side of the active structure layer away from the base substrate, a source drain metal layer disposed on the fourth insulation layer, wherein the source drain metal layer includes a first source electrode, a first drain electrode, a second source electrode, a second drain electrode, and a first connection electrode, the first source electrode and the first drain electrode are connected with a first active layer of the first transistor through a first via, the second source electrode and the second drain electrode are connected with a second active layer of the second transistor through a second via, and the first connection electrode is connected with the first bottom gate electrode of the first transistor through a third via.

In an exemplary implementation mode, a depth of the first via is 5000 Å to 9000 Å and a depth of the second via is 4000 Å to 7000 Å.

In an exemplary implementation mode, a difference between the depth of the first via and the depth of the second via is less than or equal to 2000 Å.

In an exemplary implementation mode, the fourth insulation layer includes a silicon oxide sub-layer and a silicon nitride sub-layer which are stacked, a thickness of the silicon nitride sub-layer is less than or equal to 1.5 times a thickness of the silicon oxide sub-layer.

In an exemplary implementation mode, a thickness of the first insulation layer is less than or equal to 3 times a thickness of the second insulation layer.

In an exemplary implementation mode, a groove is provided on the base substrate, at least part of the second bottom gate electrode is disposed in the groove, at least part of a second active layer of the second transistor is disposed in the groove, and a second top gate electrode of the second transistor is disposed in the groove.

In an exemplary implementation mode, a depth of the groove is greater than or equal to 4000 Å and a width of the groove is greater than or equal to 1.2 times a distance between a source region and a drain region of the second active layer in the second transistor.

In another aspect, the present disclosure further provides a display apparatus, including the aforementioned display substrate.

In yet another aspect, the present disclosure further provides a preparation method of a display substrate, including: forming a drive structure layer on a base substrate, wherein the drive structure layer includes a first transistor and a second transistor arranged side by side, the first transistor includes a low temperature poly silicon transistor, and the second transistor includes an oxide transistor; the first transistor includes a first bottom gate electrode simultaneously served as a shielding layer, and the second transistor includes a second bottom gate electrode simultaneously served as a shielding layer, and the first bottom gate electrode and the second bottom gate electrode are arranged in a same layer and simultaneously formed through a same patterning process.

In an exemplary embodiment, the forming the drive layer on the base substrate includes: forming a first conductive layer on the base substrate, wherein the first conductive layer includes the first bottom gate electrode and the second bottom gate electrode, which are arranged in the same layer and simultaneously formed through the same patterning process; forming an active structure layer on the first conductive layer, wherein the active structure layer includes a first active layer and a first top gate electrode of the first transistor, and a second active layer and a second top gate electrode of the second transistor; and forming a source drain structure layer on the active structure layer, wherein the source drain structure layer includes a first source electrode and a first drain electrode of the first transistor, a first connection electrode, and a second source electrode and a second drain electrode of the second transistor, the first source electrode and the first drain electrode are connected with the first active layer through a first via, the second source electrode and the second drain electrode are connected with the second active layer through a second via, and the first connection electrode is connected with the first bottom gate electrode through a third via; the first via, the second via, and the third via are formed simultaneously through a same patterning process.

In an exemplary implementation mode, the forming the first conductive layer on the base substrate includes: forming a base substrate, wherein the base substrate includes a first flexible layer, a first barrier layer, a second flexible layer, and a second barrier layer which are stacked, a groove is provided on the second barrier layer, and a depth of the groove is greater than or equal to 4000 Å; and forming a first conductive layer on the base substrate, wherein the first conductive layer includes a first bottom gate electrode and a second bottom gate electrode which are arranged in a same layer and formed simultaneously through a same patterning process, and at least part of the second bottom gate electrode is disposed in the groove.

In an exemplary implementation mode, the forming the active structure layer on the first conductive layer includes: forming a first insulation layer covering the first conductive layer, and a first active layer of the first transistor disposed on the first insulation layer; forming a second insulation layer covering the first active layer, and a first top gate electrode of the first transistor disposed on the second insulation layer; performing a doping treatment by taking the first top gate electrode as a shield; forming a second active layer of the second transistor on the second insulation layer; and forming a third insulation layer covering the first top gate electrode and the second active layer, and a second top gate electrode of the second transistor disposed on the third insulation layer.

In an exemplary implementation mode, the forming the active structure layer on the first conductive layer includes: forming a first insulation layer covering the first conductive layer, and a first active layer of the first transistor disposed on the first insulation layer; forming a second insulation layer covering the first active layer, and a photoresist shielding pattern disposed on the second insulation layer; performing a doping treatment by taking the photoresist shielding pattern as a shield; forming a second active layer of the second transistor on the second insulation layer; and forming a third insulation layer covering a second semiconductor layer, and a first top gate electrode of the first transistor and a second top gate electrode of the second transistor disposed on the third insulation layer.

In an exemplary implementation mode, a depth of the first via is 5000 Å to 9000 Å, and a depth of the second via is 4000 Å to 7000 Å, and a difference between the depth of the first via and the depth of the second via is less than or equal to 2000 Å.

Other aspects will become apparent upon reading and understanding the drawings and detailed description.

BRIEF DESCRIPTION OF DRAWINGS

The drawings provide a further understanding to the technical solutions of the present disclosure, form a part of the specification, and are adopted to explain, together with the embodiments of the present disclosure, the technical solutions of the present disclosure and not intended to form limits to the technical solutions of the present disclosure. Shapes and sizes of various components in the drawings do not reflect actual scales and are only intended to illustrate contents of the present disclosure.

Figure 1:
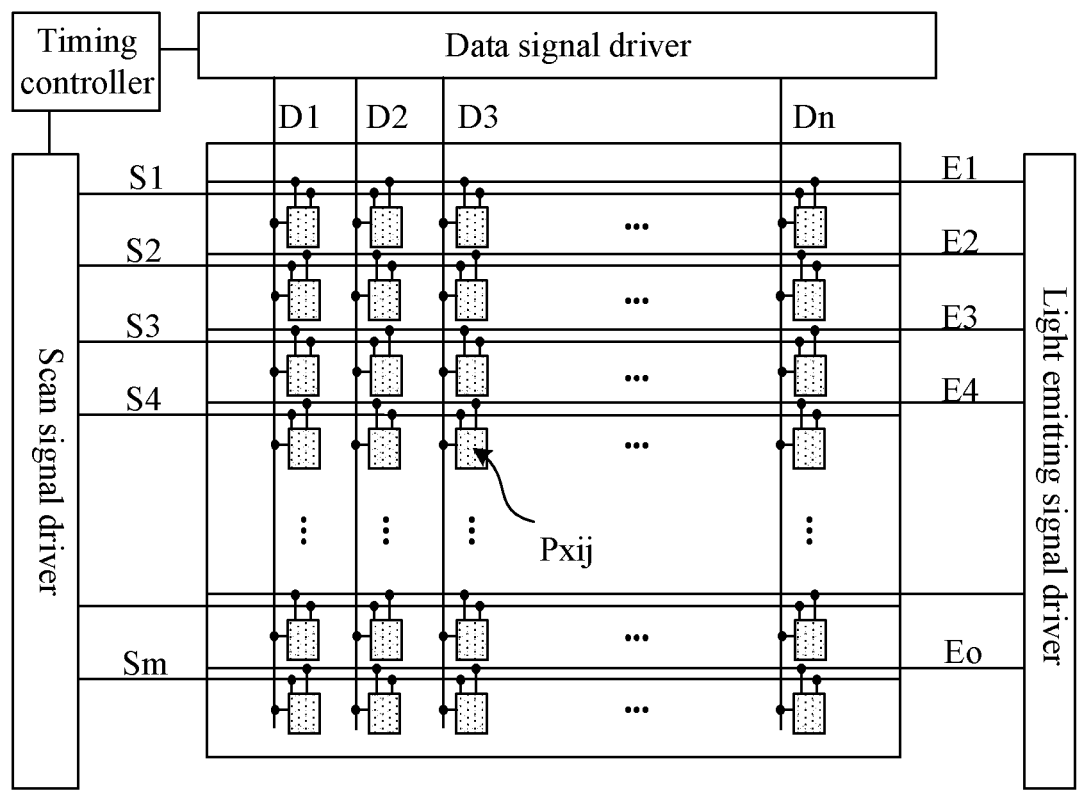
FIG. 1 is a schematic diagram of a structure of a display apparatus.

Sometimes for clarity, sizes of various constituent elements, thicknesses of layers, or regions in the drawings may be exaggerated. Therefore, one mode of the present disclosure is not necessarily limited to the sizes, and a shape and a size of each component in the drawings do not reflect a true scale. In addition, the drawings schematically illustrate ideal examples, and one mode of the present disclosure is not limited to shapes, numerical values, or the like shown in the drawings.

Ordinal numerals such as "first", "second", and "third", in the specification are set not to form limits in number but only to avoid confusion of constituent elements.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements are changed appropriately according to a direction in which the various constituent elements are described. Therefore, appropriate replacements may be made according to situations without being limited to the wordings described in the specification.

| Descriptions of reference signs are as follows. | | |
| --- | --- | --- |
| 1-glass carrier plate; | 10-base substrate; | 11-first insulation layer; |
| 12-second insulation layer; | 13-third insulation layer; | 14-fourth insulation layer; |
| 15-first planarization layer; | 16-second planarization layer; | 20-first transistor; |
| 21-first bottom gate electrode; | 22-first active layer; | 23-first top gate electrode; |
| 24-first source electrode; | 25-first drain electrode; | 26-first connection electrode; |
| 27-second connection electrode; | 28-anode; | 30-second transistor; |
| 31-second bottom gate electrode; | 32-second active layer; | 33-second top gate electrode; |
| 34-second source electrode; | 35-second drain electrode; | 36-shielding layer; |
| 91-first groove; | 92-second groove; | 93-third groove; |
| 100-drive structure layer. | | |

DETAILED DESCRIPTION

In order to make purposes, technical solutions, and advantages of the present disclosure more clear, the embodiments of the present disclosure will be described in detail below in combination with the drawings. It is to be noted that implementation modes may be implemented in multiple different forms. Those of ordinary skill in the art may easily understand such a fact that manners and contents may be transformed into various forms without departing from the spirit and scope of the present disclosure. Therefore, the present disclosure should not be construed as being only limited to the contents described in the following implementation modes. The embodiments in the present disclosure and features in the embodiments may be combined randomly with each other if there is no conflict. In order to keep the following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to specific situations.

In the specification, a transistor refers to a component which at least includes three terminals of a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region that a current mainly flows through.

In the specification, a first electrode may be the drain electrode, and a second electrode may be the source electrode. Or, a first electrode may be the source electrode, and a second electrode may be the drain electrode. In a case that transistors with opposite polarities are used, or a direction of a current changes during work of a circuit, or the like, functions of the "source electrode" and the "drain electrode" are sometimes interchangeable. Therefore, the "source electrode" and the "drain electrode" are interchangeable in the specification.

In the specification, an "electrical connection" includes a case that constituent elements are connected together through an element with some electrical function. The "element with some electrical function" is not particularly limited as long as electrical signals may be sent and received between the connected constituent elements. Examples of the "element with some electrical function" include not only an electrode and a wiring, but also a switching element such as a transistor, a resistor, an inductor, a capacitor, and other elements with various functions.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, sometimes a "conductive layer" may be replaced with a "conductive film". Similarly, sometimes an "insulation film" may be replaced with an "insulation layer".

In the present disclosure, "about" refers to that a boundary is defined not so strictly and numerical values within process and measurement error ranges are allowed.

FIG. 1 is a schematic diagram of a structure of a display apparatus. As shown in FIG. 1, an OLED display apparatus may include a timing controller, a data signal driver, a scan signal driver, a light emitting signal driver, and a pixel array, wherein the pixel array may include multiple scan signal lines (S1 to Sm), multiple data signal lines (D1 to Dn), multiple light emitting signal lines (E1 to Eo), and multiple sub-pixels Pxij. In an exemplary implementation mode, the timing controller may provide a gray-scale value and a control signal suitable for a specification of the data signal driver to the data signal driver, may provide a clock signal, a scan starting signal, etc., suitable for a specification of the scan signal driver to the scan signal driver, and may provide a clock signal, an emission stopping signal, etc., suitable for a specification of the light emitting signal driver to the light emitting signal driver. The data signal driver may generate a data voltage to be provided to the data signal lines D1, D2, D3, . . . , and Dn using the gray-scale value and the control signal that are received from the timing controller. For example, the data signal driver may sample the gray-scale value using a clock signal and apply a data voltage corresponding to the gray-scale value to the data signal lines D1 to Dn by taking a pixel row as a unit, wherein n may be a natural number. The scan signal driver may generate a scan signal to be provided to the scan signal lines S1, S2, S3, . . . , and Sm by receiving a clock signal, a scan starting signal, etc., from the timing controller. For example, the scan signal driver may sequentially provide a scan signal with an on-level pulse to the scan signal lines S1 to Sm. For example, the scan signal driver may be constructed in a form of a shift register and generate a scan signal in a manner of sequentially transmitting a scan starting signal provided in a form of an on-level pulse to a next-stage circuit under control of a clock signal, wherein m may be a natural number. The light emitting signal driver may generate an emission signal to be provided to the light emitting signal lines E1, E2, E3, . . . , and Eo by receiving a clock signal, an emission stopping signal, etc., from the timing controller. For example, the light emitting signal driver may sequentially provide an emission signal with an off-level pulse to the light emitting signal lines E1 to Eo. For example, the light emitting signal driver may be constructed in a form of a shift register and generate a light emitting signal in a manner of sequentially transmitting a light emitting stopping signal provided in a form of an off-level pulse to a next-stage circuit under control of a clock signal, wherein o may be a natural number. The pixel array may include multiple sub-pixels Pxij. Each sub-pixel Pxij may be connected with a corresponding data signal line, a corresponding scan signal line, and a corresponding light emitting signal line, wherein i and j may be natural numbers. The sub-pixel Pxij may refer to a sub-pixel in which a transistor is connected with an i-th scan signal line and connected with a j-th data signal line.

Figure 2:
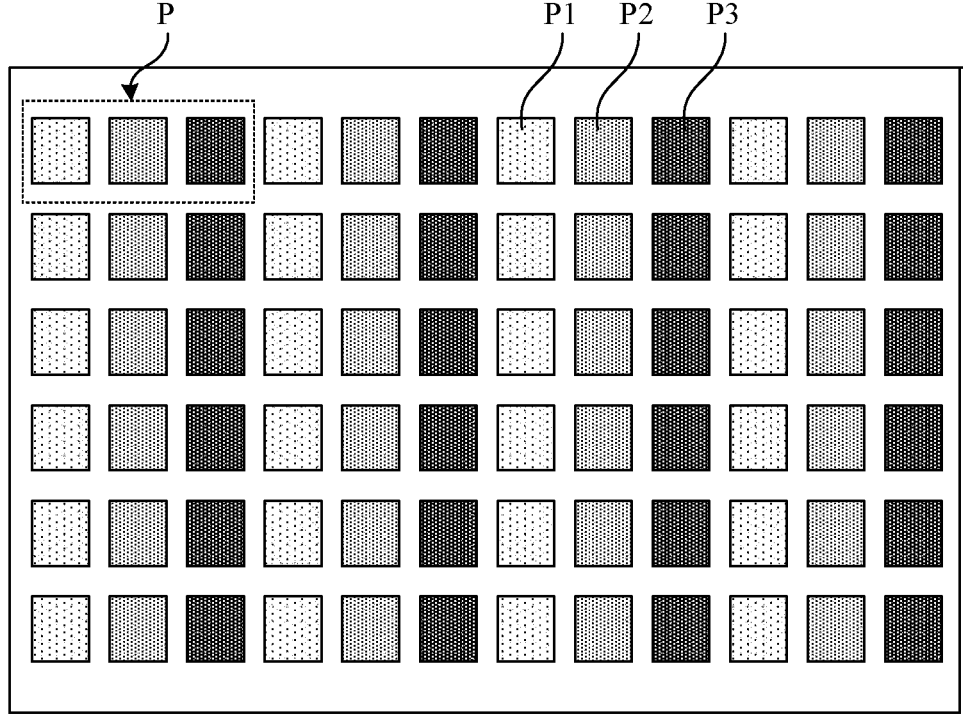
FIG. 2 is a schematic diagram of a planar structure of a display substrate.

FIG. 2 is a schematic diagram of a planar structure of a display substrate. As shown in FIG. 2, the display substrate may include multiple pixel units P arranged in a matrix, at least one of the multiple pixel units P includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light emitting device. The pixel drive circuit in the first sub-pixel P1, the second sub-pixel P2, and the third sub-pixel P3 is connected with a scan signal line, a data signal line, and a light emitting signal line respectively. The pixel drive circuit is configured to receive a data voltage transmitted by the data signal line under control of the scan signal line and the light emitting signal line, and output a corresponding current to the light emitting device. The light emitting device in the first sub-pixel P1, the second sub-pixel P2, and the third sub-pixel P3 is connected with a pixel drive circuit of a sub-pixel where the light emitting device is located, and is configured to emit light with a corresponding brightness in response to a current output by the pixel drive circuit of the sub-pixel where the light emitting device is located.

In an exemplary implementation mode, a pixel unit P may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure. In an exemplary implementation mode, a shape of a sub-pixel in a pixel unit may be a rectangle, a rhombus, a pentagon, or a hexagon. When the pixel unit includes three sub-pixels, the three sub-pixels may be arranged side by side horizontally, side by side vertically, or in a manner like a Chinese character "品"; and when the pixel unit includes four sub-pixels, the four sub-pixels may be arranged side by side horizontally, side by side vertically, or in a manner to form a square, which is not limited in the present disclosure.

Figure 3:
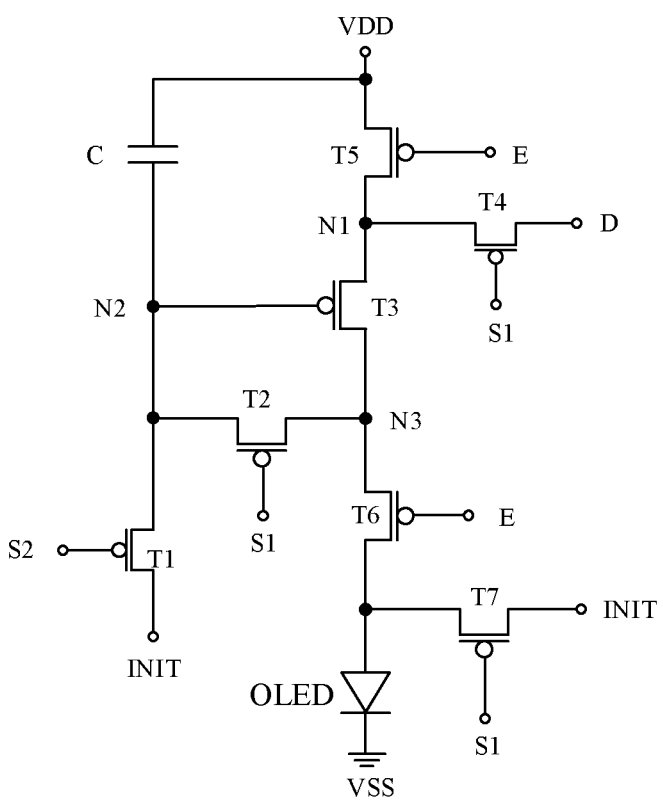
FIG. 3 is a schematic diagram of an equivalent circuit of a pixel drive circuit.

In an exemplary implementation mode, the pixel drive circuit may be in a 3T1C, 4T1C, 5T1C, 5T2C, 6T1C, or 7T1C structure. FIG. 3 is a schematic diagram of an equivalent circuit of a pixel drive circuit. As shown in FIG. 3, the pixel drive circuit may include seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS).

In an exemplary implementation mode, a first end of the storage capacitor C is connected with the first power supply line VDD, and a second end of the storage capacitor C is connected with a second node N2, namely the second end of the storage capacitor C is connected with a control electrode of the third transistor T3.

A control electrode of the first transistor T1 is connected with the second scan signal line S2, a first electrode of the first transistor T1 is connected with the initial signal line INIT, and a second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, a first electrode of the second transistor T2 is connected with the second node N2, and a second electrode of the second transistor T2 is connected with a third node N3. When a scan signal with an on-level is applied to the first scan signal line S1, the second transistor T2 enables the control electrode of the third transistor T3 to be connected with the second electrode thereof.

The control electrode of the third transistor T3 is connected with the second node N2, namely the control electrode of the third transistor T3 is connected with the second end of the storage capacitor C, a first electrode of the third transistor T3 is connected with a first node N1, and a second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switching transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of the light emitting device. The fifth transistor T5 and the sixth transistor T6 may be referred to as light emitting transistors. When a light emitting signal with an on-level is applied to the light emitting signal line E, the fifth transistor T5 and the sixth transistor T6 form a drive current path between the first power supply line VDD and the second power supply line VSS to enable the light emitting device to emit light.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation mode, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in a pixel drive circuit of a present display row, and the second scan signal line S2 is a scan signal line in a pixel drive circuit of a previous display row. That is, for an n-th display row, the first scan signal line S1 is S(n), and the second scan signal line S2 is S(n–1). A second scan signal line S2 of the present display row and a first scan signal line S1 in the pixel drive circuit of the previous display row are a same signal line. Signal lines of the display panel may be reduced, so that a narrow border of the display panel may be achieved.

In an exemplary implementation mode, the first transistor T1 to the seventh transistor T7 may be P-type transistors or N-type transistors. Use of a same type of transistors in a pixel drive circuit may simplify a process flow, reduce a process difficulty of a display panel, and improve a yield of a product. In some possible implementation modes, the first transistor T1 to the seventh transistor T7 may include a P-type transistor and an N-type transistor.

In an exemplary implementation mode, the first scan signal line S1, the second scan signal line S2, the light emitting signal line E, and the initial signal line INIT extend along a horizontal direction, and the second power supply line VSS, the first power supply line VDD, and the data signal line D extend along a vertical direction.

In an exemplary implementation mode, the light emitting device may be an Organic Light Emitting Diode (OLED), including a first electrode (anode), an organic light emitting layer, and a second electrode (cathode) that are stacked.

Figure 4:
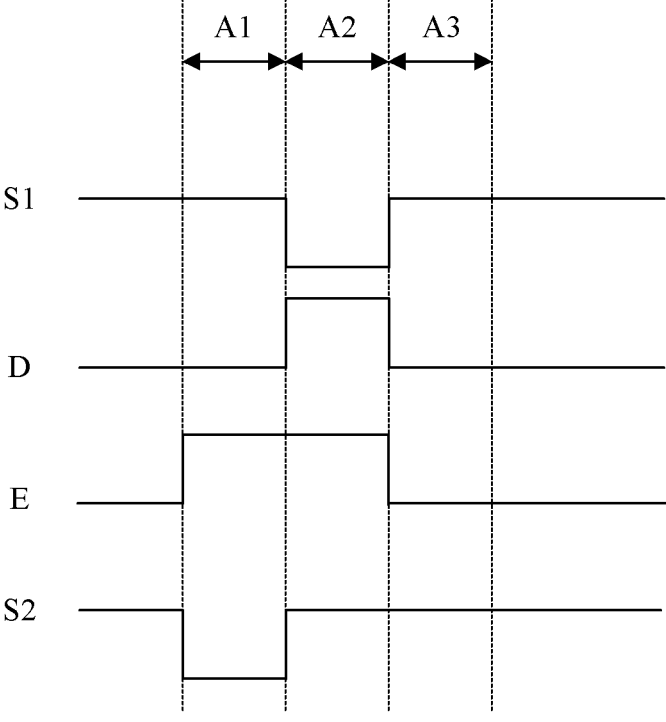
FIG. 4 is a working timing diagram of a pixel drive circuit.

FIG. 4 is a working timing diagram of a pixel drive circuit. An exemplary embodiment of the present disclosure will be described below through a working process of the pixel drive circuit shown in FIG. 3. The pixel drive circuit in FIG. 3 includes seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS), wherein all of the seven transistors are P-type transistors.

In an exemplary implementation mode, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to the second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second end of the storage capacitor C is at a low level, so that the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage of the second end (the second node N2) of the storage capacitor C is Vd-|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. The signal of the second scan signal line S2 is the high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (a drive transistor) is determined by a voltage difference between a gate electrode and a first electrode of the third transistor T3. A voltage of the second node N2 is Vdata-|Vth|, so that the drive current of the third transistor T3 is as follows.

$$I=K*(Vgs-Vth)^2=K*[(Vdd-Vd+|Vth|)-Vth]^2=K* \\ [(Vdd-Vd]^2$$

I is the drive current flowing through the third transistor T3, i.e., a drive current for driving the OLED, K is a constant, Vgs is the voltage difference between the gate electrode and first electrode of the third transistor T3, Vth is the threshold voltage of the third transistor T3, Vd is the data voltage output by the data signal line D, and Vdd is the power voltage output by the first power supply line VDD.

In an exemplary implementation mode, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature poly silicon thin film transistor has advantages such as a high migration rate and fast charging. The oxide thin film transistor has advantages such as a low leakage current. The low temperature poly silicon thin film transistor and the oxide thin film transistor are integrated on one display substrate to form a Low Temperature Polycrystalline Oxide (LTPO for short) display substrate, so that advantages of the low temperature poly silicon thin film transistor and the oxide thin film transistor may be utilized, low-frequency drive may be realized, power consumption may be reduced (saving 5% to 15% of an electricity amount), and display quality may be improved.

The present disclosure provides a display substrate including a base substrate and a drive structure layer disposed on the base substrate, wherein the drive structure layer includes a first transistor and a second transistor arranged side by side, the first transistor includes a low temperature poly silicon transistor, and the second transistor includes an oxide transistor; the first transistor includes a first bottom gate electrode simultaneously served as a shielding layer, and the second transistor includes a second bottom gate electrode simultaneously served as a shielding layer, wherein the first bottom gate electrode and the second bottom gate electrode are arranged in a same layer.

In an exemplary implementation mode, the drive structure layer may include a first conductive layer disposed on the base substrate, an active structure layer disposed on a side of the first conductive layer away from the base substrate, and a source drain structure layer disposed on a side of the active structure layer away from the base substrate; the first conductive layer includes the first bottom gate electrode and the second bottom gate electrode arranged in the same layer In an exemplary implementation mode, the active structure layer may include: a first insulation layer covering the first conductive layer, a first active layer of the first transistor disposed on a side of the first insulation layer away from the base substrate, a second insulation layer covering the first active layer, a first top gate electrode of the first transistor disposed on a side of the second insulation layer away from the base substrate, a second active layer of the second transistor disposed on a side of the second insulation layer away from the base substrate, a third insulation layer covering the first gate top electrode and the second active layer, a second top gate electrode of the second transistor disposed on a side of the third insulation layer away from the base substrate.

In an exemplary implementation mode, the active structure layer may include: a first insulation layer covering the first conductive layer, a first active layer of the first transistor disposed on a side of the first insulation layer away from the base substrate, a second insulation layer covering the first active layer, a second active layer of the second transistor disposed on a side of the second insulation layer away from the base substrate, a third insulation layer covering the second active layer, a first top gate electrode of the first transistor and a second top gate electrode of the second transistor disposed on a side of the third insulation layer away from the base substrate; the first top gate electrode and the second top gate electrode are arranged in the same layer.

Figure 5:
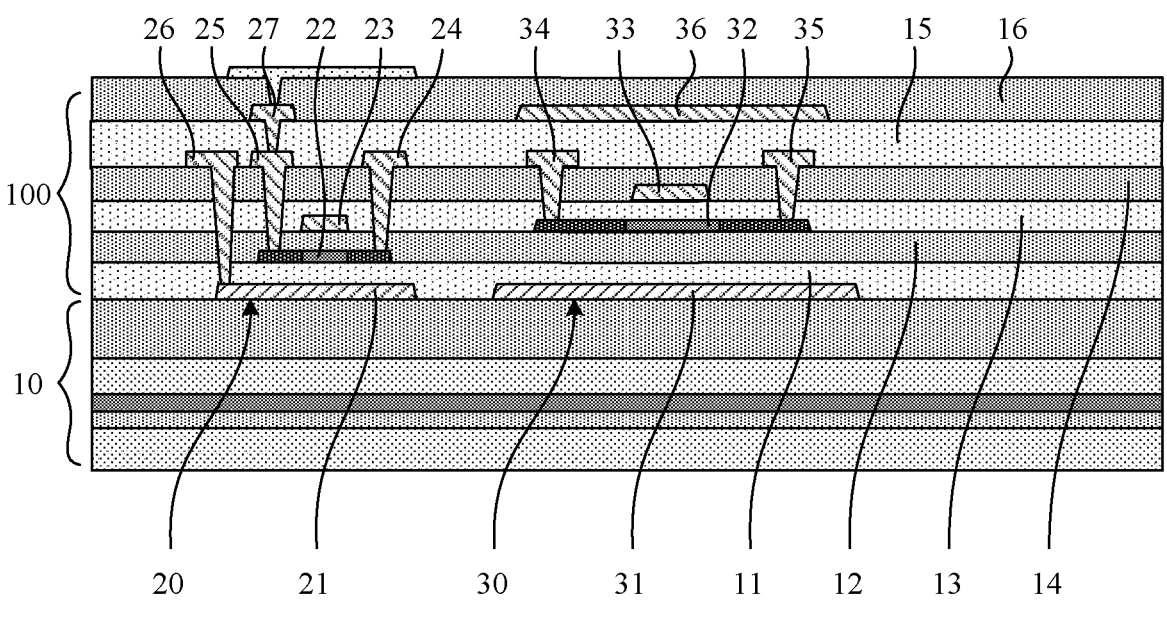
FIG. 5 is a schematic diagram of a structure of a display substrate according to an exemplary embodiment of the present disclosure.

FIG. 5 is a schematic diagram of a structure of a display substrate according to an exemplary embodiment of the present disclosure. As shown in FIG. 5, the display substrate may include a base substrate 10 and a drive structure layer 100 disposed on the base substrate 10, and the drive structure layer 100 may include a first transistor 20 and a second transistor 30 arranged side by side. The first transistor 20 may include a first bottom gate electrode 21, a first active layer 22, a first top gate electrode 23, a first source electrode 24, and a first drain electrode 25, wherein the first bottom gate electrode 21 simultaneously is served as a shielding layer of the first transistor 20. The second transistor 30 may include a second bottom gate electrode 31, a second active layer 32, a second top gate electrode 33, a second source electrode 34, and a second drain electrode 35, wherein the second bottom gate electrode 31 simultaneously served as a shielding layer of the second transistor 30.

In an exemplary implementation mode, the first bottom gate electrode 21 and the second bottom gate electrode 31 are disposed in a same layer, and formed simultaneously through a same patterning process.

In an exemplary implementation mode, the drive structure layer 100 of the exemplary embodiment may include: a first conductive layer disposed on the base substrate 10, wherein the first conductive layer at least includes a first bottom gate electrode 21 and a second bottom gate electrode 31; a first insulation layer 11 covering the first conductive layer, a first semiconductor layer disposed on the first insulation layer 11, wherein the first semiconductor layer at least includes a first active layer 22; a second insulation layer 12 covering the first semiconductor layer, a second conductive layer and a second semiconductor layer disposed on the second insulation layer 12, wherein the second conductive layer at least includes the first top gate electrode 23, and the second semiconductor layer at least includes the second active layer 32; a third insulation layer 13 covering the second conductive layer and the second semiconductor layer, a third conductive layer disposed on the third insulation layer 13, wherein the third conductive layer at least includes the second top gate electrode 33; a fourth insulation layer 14 covering the third conductive layer, a fourth conductive layer disposed on the fourth insulation layer 14, wherein the fourth conductive layer at least includes the first source electrode 24, the first drain electrode 25, the second source electrode 34, the second drain electrode 35, and a first connection electrode 26, the first source electrode 24 and the first drain electrode 25 are respectively connected with the first active layer 22 through a via, the second source electrode 34 and the second drain electrode 35 are respectively connected with the second active layer 32 through a via, and the first connection electrode 26 is connected with the first bottom gate electrode 21 through a via.

In an exemplary implementation mode, the drive structure layer 100 may include a first planarization layer 15 covering the fourth conductive layer, a fifth conductive layer disposed on the first planarization layer 15, and a second planarization layer 16 covering the fifth conductive layer. The fifth conductive layer at least includes a second connection electrode 27 and a shielding layer 36, the second connection electrode 27 is connected with the first drain electrode 25 through a via, and the shielding layer 36 is served as a shielding layer of the second transistor 30. An orthographic projection of the shielding layer 36 on the base substrate contains an orthographic projection of the second active layer 32 on the base substrate. The second planarization layer 16 is provided with a via, and the via exposes the second connection electrode 27.

In an exemplary implementation mode, the display substrate may include a light emitting structure layer, and the light emitting structure layer may include an anode, a pixel definition layer, an organic light emitting layer, and a cathode. The anode is disposed on the second planarization layer, and is connected with the second connection electrode 27 through a via, a pixel opening is provided on the pixel definition layer and exposes a surface of the anode, the organic light emitting layer is connected with the anode through the pixel opening, the cathode is connected with the organic light emitting layer, and the organic light emitting layer emits light of a corresponding color under drive of the anode and the cathode.

In an exemplary implementation mode, the display substrate may include an encapsulation layer, and the encapsulation layer may include a first encapsulation layer, a second encapsulation layer, and a third encapsulation layer which are stacked. The first encapsulation layer and the third encapsulation layer may be made of an inorganic material, and the second encapsulation layer may be made of an organic material. The second encapsulation layer is arranged between the first encapsulation layer and the third encapsulation layer, which may ensure that external water vapor cannot enter the light emitting structure layer.

In an exemplary implementation mode, a material of the first active layer 22 may include low temperature poly silicon, and a material of the second active layer 32 may include an oxide.

Figure 6:
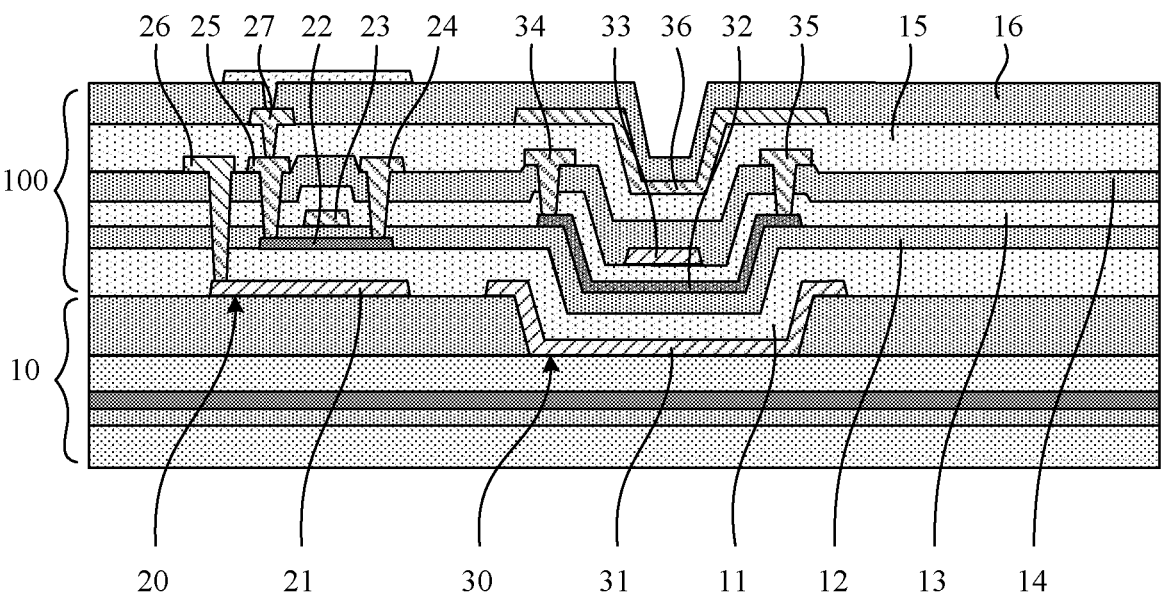
FIG. 6 is a schematic diagram of a structure of another display substrate according to an exemplary embodiment of the present disclosure.

FIG. 6 is a schematic diagram of a structure of another display substrate according to an exemplary embodiment of the present disclosure. As shown in FIG. 6, the display substrate may include a base substrate 10 and a drive structure layer 100 disposed on the base substrate 10, the drive structure layer 100 includes a first transistor 20 and a second transistor 30 arranged side by side, the first transistor 20 may be a low temperature poly silicon transistor, the second transistor 30 may be an oxide transistor, and a first bottom gate electrode 21 of the first transistor 20 and a second bottom gate electrode 31 of the second transistor 30 are arranged in a same layer and formed simultaneously through a same patterning process. Different from the structure shown in FIG. 5, the drive structure layer 100 of the exemplary embodiment is provided with a groove which is disposed in a region where the second transistor 20 is located.

In an exemplary implementation mode, the drive structure layer 100 of the exemplary embodiment may include: a first groove disposed on the base substrate 10, wherein the first groove is disposed in a region where the second transistor 20 is located; a first conductive layer disposed on the base substrate 10, wherein the first conductive layer at least includes the first bottom gate electrode 21 and the second bottom gate electrode 31, a middle region of the second bottom gate electrode 31 is disposed in the first groove; a first insulation layer 11 covering the first conductive layer, a first semiconductor layer disposed on the first insulation layer 11, wherein the first semiconductor layer at least includes a first active layer 22; a second insulation layer 12 covering the first semiconductor layer, a second conductive layer and a second semiconductor layer disposed on the second insulation layer 12, wherein the second conductive layer at least includes a first top gate electrode 23, the second semiconductor layer at least includes a second active layer 32, a middle region of the second active layer 32 is disposed in the first groove; a third insulation layer 13 covering the second conductive layer and the second semiconductor layer, a third conductive layer disposed on the third insulation layer 13, wherein the third conductive layer at least includes a second top gate electrode 33 disposed in the first groove; a fourth insulation layer 14 covering the third conductive layer, a fourth conductive layer disposed on the fourth insulation layer 14, wherein the fourth conductive layer at least includes a first source electrode 24, a first drain electrode 25, a second source electrode 34, a second drain electrode 35, and a first connection electrode 26, the first source electrode 24 and the first drain electrode 25 are respectively connected with the first active layer 22 through a via, the second source electrode 34 and the second drain electrode 35 are respectively connected with the second active layer 32 through a via, and the first connection electrode 26 is connected with the first bottom gate electrode 21 through a via; a first planarization layer 15 covering the fourth conductive layer, the first planarization layer 15 is provided with a second groove, wherein a position of the second groove corresponds to a position of the first groove; a fifth conductive layer disposed on the first planarization layer 15, wherein the fifth conductive layer at least includes a second connection electrode 27 and a shielding layer 36, the second connection electrode 27 is connected with the first drain electrode 25 through a via, a middle region of the shielding layer 36 is disposed in the second groove as a shielding layer of the second transistor 30, and an orthographic projection of the shielding layer 36 on the base substrate contains an orthographic projection of the second active layer 32 on the base substrate; a second planarization layer 16 covering the fifth conductive layer, wherein the second planarization layer 16 is provided with a via and the via exposes the second connection electrode 27.

Exemplary description is made below through a preparation process of a display substrate according to the exemplary embodiment. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as depositing and coating. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" which has experienced the patterning process includes at least one "pattern". "A and B being arranged in a same layer" in the present disclosure means that A and B are formed simultaneously through a same patterning process, and a "thickness" of a film layer is a dimension of the film layer in a direction perpendicular to the display substrate. In the embodiments of the present disclosure, "an orthographic projection of A including an orthographic projection of B" or "an orthographic projection of B is located within a range of an orthographic projection of A" means that a boundary of the orthographic projection of B falls within a range of a boundary of the orthographic projection of A, or the boundary of the orthographic projection of A is overlapped with the boundary of the orthographic projection of B.

FIG. 7 to FIG. 18 are schematic diagrams of a preparation process of a display substrate. In an exemplary implementation mode, the preparation process of the display substrate according to the exemplary embodiment may include following operations.

Figure 7:
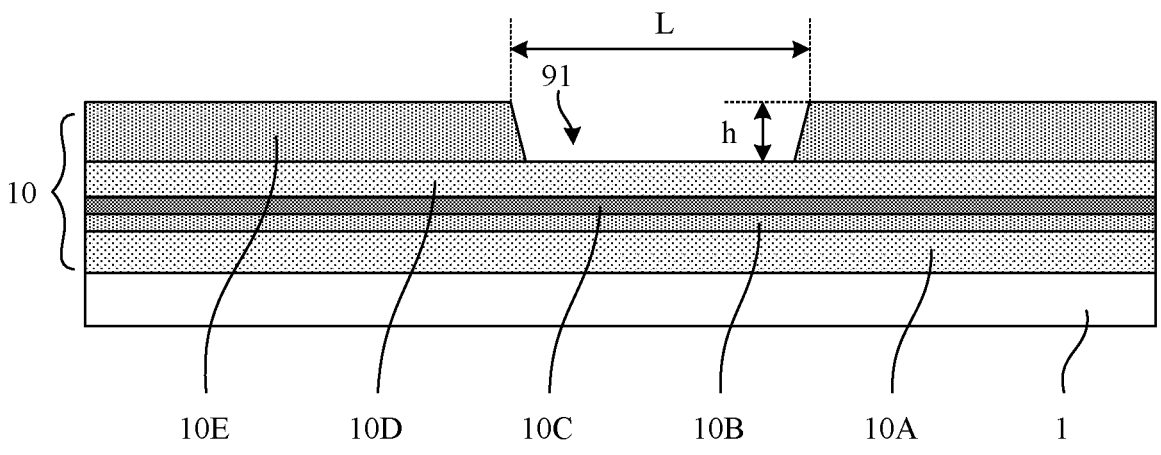
FIG. 7 is a schematic diagram of another display substrate after a base substrate is formed according to the present disclosure.

(A1) A base substrate 10 is prepared on a glass carrier plate 1. In an exemplary implementation mode, the base substrate 10 may include a first flexible material layer, a first inorganic material layer, a semiconductor layer, a second flexible material layer, and a second inorganic material layer which are stacked on the glass carrier plate 1. Materials of the first and second flexible material layers may be polyimide (PI), polyethylene terephthalate (PET), or a polymer soft film subjected to a surface treatment, etc. Materials of the first and second inorganic material layers may be Silicon Nitride (SiNx), Silicon Oxide (SiOx), or the like, so as to improve a water and oxygen resistance capability of the base substrate. The first and second inorganic material layers are also referred to as barrier layers. A material of the semiconductor layer may be amorphous silicon (a-si). In an exemplary implementation mode, taking a stacked layer structure PI1/Barrier1/a-si/PI2/Barrier2 as an example, the preparation process may include: first coating a layer of polyimide on the glass carrier plate 1, and then forming a first flexible (PI1) layer 10A after the polyimide is cured and formed as a film; then, depositing a layer of barrier thin film on the first flexible layer to form a first barrier (Barrier1) layer 10B covering the first flexible layer; then, depositing a layer of amorphous silicon thin film on the first barrier layer to form an amorphous silicon (a-si) layer 10C covering the first barrier layer; then, coating a layer of polyimide on the amorphous silicon layer, and forming a second flexible (PI2) layer 10D after the polyimide is cured and formed as a film; then, depositing a layer of barrier thin film on the second flexible layer to form a second barrier (Barrier2) thin film covering the second flexible layer, patterning the second barrier thin film layer through a patterning process to from a second barrier layer 10E provided with a first groove 91, thus completing preparation of the base substrate 10, as shown in FIG. 7.

In an exemplary implementation mode, a depth h of the first groove 91 may be greater than or equal to 4000 Å.

In an exemplary implementation mode, the second barrier thin film in the first groove 91 is etched away and a surface of the second flexible layer 10D may be exposed.

In an exemplary implementation mode, a width L of the first groove 91 may be greater than or equal to 1.2 times a distance between a source region and a drain region in the second active layer subsequently formed.

Figure 8:
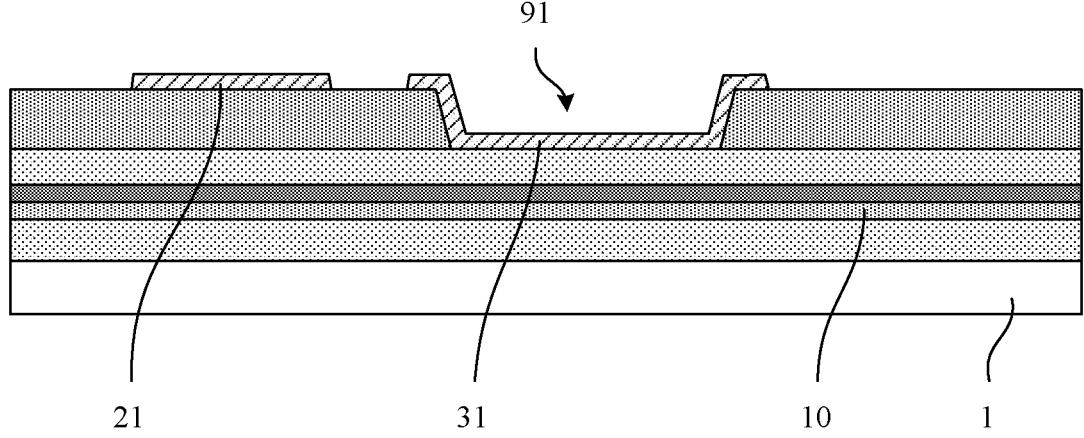
FIG. 8 is a schematic diagram of another display substrate after a pattern of a first conductive layer is formed according to the present disclosure.

(A2) A pattern of a first conductive layer is formed. In an exemplary implementation mode, forming a pattern of a first conductive layer may include: depositing a first metal thin film on the base substrate 10, patterning the first metal thin film through a patterning process, and forming a pattern of a first conductive layer on the base substrate 10, wherein the pattern of the first conductive layer at least includes the first bottom gate electrode 21 and the second bottom gate electrode 31, a middle region of the second bottom gate electrode 31 is disposed in the first groove 91, and an edge region of the second bottom gate electrode 31 is disposed on the base substrate 10 (the second barrier layer), as shown in FIG. 8.

In an exemplary implementation mode, the first bottom gate electrode 21 may serve as both a shielding layer and a bottom gate electrode of the first transistor, and the second bottom gate electrode 31 may serve as both a shielding layer and a bottom gate electrode of the second transistor.

In an exemplary implementation mode, the first conductive layer may be referred to as a Light Shielding layer (LS), and a thickness of the first conductive layer may be about 2000 Å to 5000 Å. For example, a thickness of the first conductive layer may be about 2500 Å.

Figure 9:
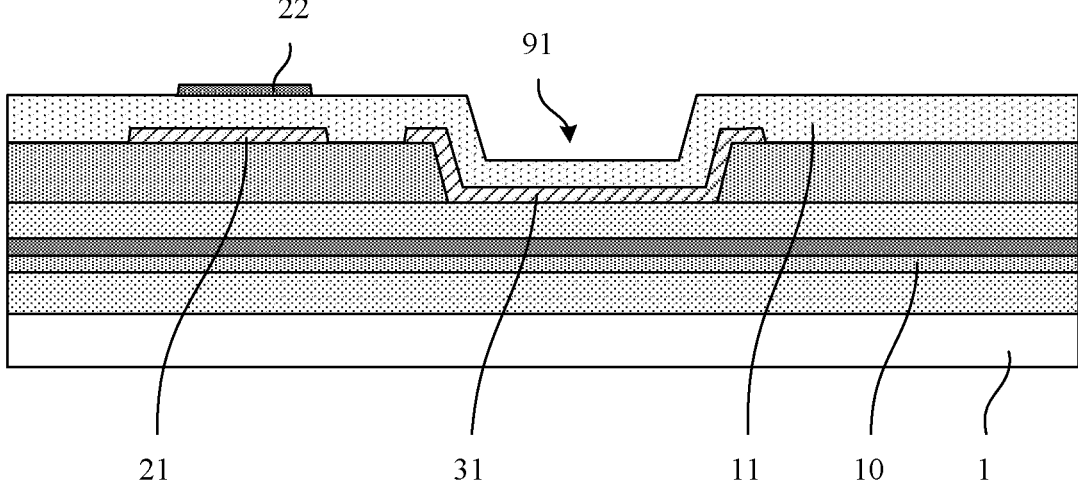
FIG. 9 is a schematic diagram of another display substrate after a pattern of a first semiconductor layer is formed according to the present disclosure.

(A3) A pattern of a first semiconductor layer is formed. In an exemplary implementation mode, forming a pattern of a first semiconductor layer may include: on the base substrate where the aforementioned patterns are formed, sequentially depositing a first insulation thin film and a first semiconductor thin film, and patterning the first semiconductor thin film through a patterning process to form a first insulation layer 11 covering the entire base substrate 10 and a pattern of a first semiconductor layer disposed on the first insulation layer 11, wherein the pattern of the first semiconductor layer at least includes the first active layer 22, as shown in FIG. 9.

In an exemplary implementation mode, the first active layer 22 may be a low temperature poly silicon active layer, and an orthographic projection of the first active layer on the base substrate is located within a range of an orthographic projection of the first bottom gate electrode 21 on the base substrate.

In an exemplary implementation mode, the patterning the first semiconductor thin film through the patterning process may include: forming an amorphous silicon (a-si) thin film on the first insulation thin film, dehydrogenating the amorphous silicon thin film, and crystallizing the dehydrogenated amorphous silicon thin film to form a poly silicon thin film. Subsequently, the poly silicon thin film is patterned to form the pattern of the first semiconductor layer. Since a large amount of hydrogen existing in amorphous silicon tend to cause a defect in subsequent processes, a dehydrogenating process needs to be performed after the amorphous silicon thin film is formed. A crystallization process is a process for crystallizing amorphous silicon to form poly silicon (p-si). For example, the crystallization process may be performed through an Excimer Laser Annealing (ELA) process. Since an annealing process for forming poly silicon may damage an oxide, preparation of the first active layer of low temperature poly silicon is set before preparation of the second active layer of a metal oxide.

In an exemplary implementation mode, the first insulation layer may be referred to as a buffer layer and used for improving a water and oxygen resistance capability of the base substrate. The first insulation layer may be made of Silicon Oxide (SiOx) or Silicon Nitride (SiNx), it may be a single layer or may be a stacked layer of SiOx/SiNx, and a thickness of the first insulation layer may be about 2000 Å to 5000 Å.

Figure 10:
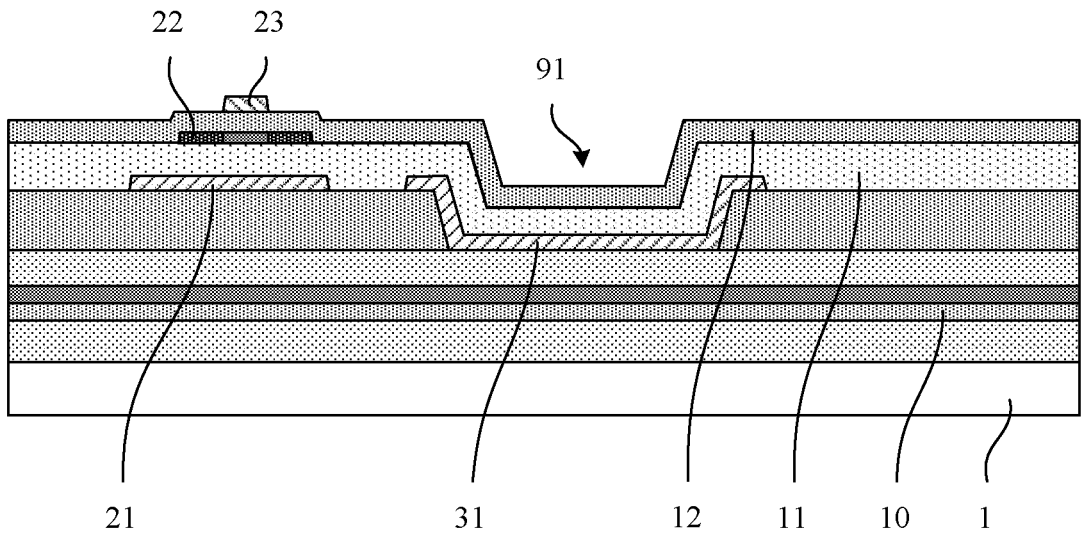
FIG. 10 is a schematic diagram of another display substrate after a pattern of a second conductive layer is formed according to the present disclosure.

(A4) A pattern of a second conductive layer is formed. In an exemplary implementation mode, forming a pattern of a second conductive layer may include: sequentially depositing a second insulation thin film and a second metal thin film on the base substrate where the aforementioned patterns are formed, and patterning the second metal thin film through a patterning process to form a second insulation layer 12 covering the pattern of the first semiconductor layer and a pattern of a second conductive layer disposed on the second insulation layer 12, wherein the pattern of the second conductive layer at least includes the first top gate electrode 23, as shown in FIG. 10.

In an exemplary implementation mode, an orthographic projection of the first top gate electrode 23 on the base substrate is located within a range of an orthographic projection of the first active layer 22 on the base substrate.

In an exemplary implementation mode, the second conductive layer may be referred to as a first gate metal (GATE1) layer. A thickness of the second conductive layer may be about 2000 Å to 5000 Å. For example, a thickness of the second conductive layer may be about 2500 Å.

In an exemplary implementation mode, the second insulation layer may be referred to as a Gate Insulator (GI). The second insulation layer may be made of SiOx or SiNx, it may be a single layer or may be a stacked layer of SiOx/SiNx. A thickness of the second insulation layer may be about 1000 Å to 2000 Å, and the thickness of the second insulation layer is less than or equal to one third of the thickness of the first insulation layer, that is, the thickness of the first insulation layer is greater than or equal to three times the thickness of the second insulation layer.

In an exemplary implementation mode, after forming the pattern of the second conductive layer, using the pattern of the second conductive layer as a shield, a doping process and an activation process are performed on regions on both sides of the first active layer 22 that are not shielded by the first top gate electrode 23, so that a channel is formed in a middle region of the first active layer 22 that is shielded by the first top gate electrode 23, and the regions on both sides that are not shielded by the first top gate electrode 23 are treated into doped regions that are respectively served as a source region and a drain region of the first active layer 22, and the source region and the drain region are configured to be connected with a first source electrode and a first drain electrode which are subsequently formed.

Figure 11:
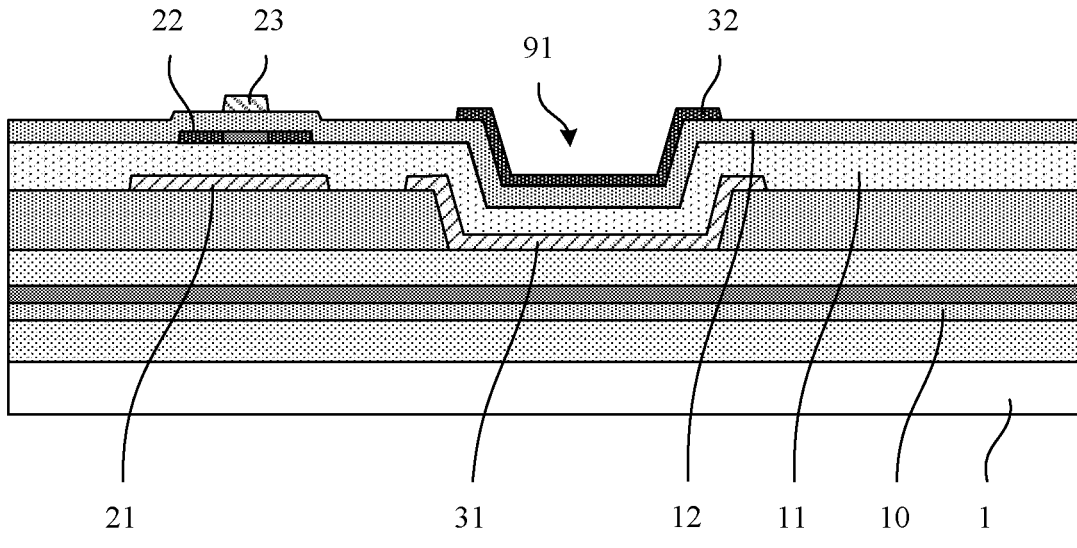
FIG. 11 is a schematic diagram of another display substrate after a pattern of a second semiconductor layer is formed according to the present disclosure.

(A5) A pattern of a second semiconductor layer is formed. In an exemplary implementation mode, forming a pattern of a second semiconductor layer may include: depositing a second semiconductor thin film on the base substrate on which the aforementioned patterns are formed, and patterning the second semiconductor thin film through a patterning process to form a pattern of a second semiconductor layer on the second insulation layer 12, wherein the pattern of the second semiconductor layer at least includes the second active layer 32, as shown in FIG. 11.

In an exemplary implementation mode, a position of the second active layer 32 corresponds to a position of the second bottom gate electrode 31, a middle region of the second active layer 32 is disposed in the first groove 91, an edge region of the second active layer is disposed on the second insulation layer 12, and an orthographic projection of the second active layer 32 on the base substrate is located within a range of an orthographic projection of the second bottom gate electrode 31 on the base substrate.

In an exemplary implementation mode, the second active layer 32 may be an oxide active layer, and an oxide may be any one or more of Indium Gallium Zinc Oxide (InGaZnO), Indium Gallium Zinc Oxynitride (InGaZnON), Zinc Oxide (ZnO), Zinc Oxynitride (ZnON), Zinc Tin Oxide (ZnSnO), Cadmium Tin Oxide (CdSnO), Gallium Tin Oxide (GaSnO), Titanium Tin Oxide (TiSnO), Copper Aluminum Oxide (CuAlO), Strontium Copper Oxide (SrCuO), Lanthanum Copper Oxysulfide (LaCuOS), Gallium Nitride (GaN), Indium Gallium Nitride (InGaN), Aluminum Gallium Nitride (AlGaN), and Indium Gallium Aluminum Nitride (InGaAlN). In some possible implementation modes, the second active layer 32 may be made of Indium Gallium Zinc Oxide (IGZO), wherein an electron mobility of the Indium Gallium Zinc Oxide (IGZO) is higher than that of amorphous silicon.

In an exemplary implementation mode, a thickness of the second active layer 32 may be about 300 Å to 500 Å. For example, the thickness of the second active layer 32 may be about 400 Å.

In an exemplary implementation mode, a distance between the middle region of the second active layer 32 located in the first groove 91 and the base substrate may be less than a distance between the first active layer 22 and the base substrate, and a distance between the edge region of the second active layer 32 located outside the first groove 91 and the base substrate may be greater than the distance between the first active layer 22 and the base substrate.

Figure 12:
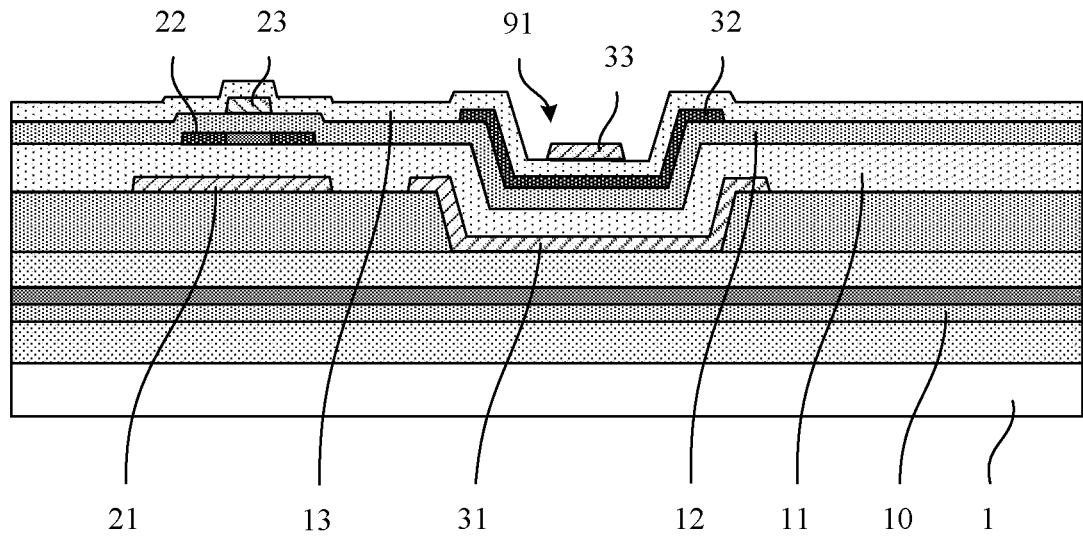
FIG. 12 is a schematic diagram of another display substrate after a pattern of a third conductive layer is formed according to the present disclosure.

(A6) A pattern of a third conductive layer is formed. In an exemplary implementation mode, forming a pattern of a third conductive layer may include: on the base substrate where the aforementioned patterns are formed, sequentially depositing a third insulation thin film and a third metal thin film, patterning the third metal thin film through a patterning process to form a third insulation layer 13 covering the pattern of second active layer and the pattern of the second conductive layer, and form a pattern of a third conductive layer disposed on the third insulation layer 13, wherein the pattern of the third conductive layer at least includes the second top gate electrode 33, as shown in FIG. 12.

In an exemplary implementation mode, the second top electrode 33 is disposed in the first groove 91, and an orthographic projection of the second top gate electrode 33 on the base substrate is located within a range of an orthographic projection of the second active layer 32 on the base substrate.

In an exemplary implementation mode, the third conductive layer may be referred to as a second gate metal (GATE2) layer. A thickness of the third conductive layer may be about 2000 Å to 5000 Å. For example, the thickness of the third conductive layer may be about 2500 Å.

In an exemplary implementation mode, the third insulation layer may be referred to as a Gate Insulator (GI). The third insulation layer may be made of SiOx, and a thickness of the third insulation layer may be about 1000 Å to 2000 Å.

Figure 13:
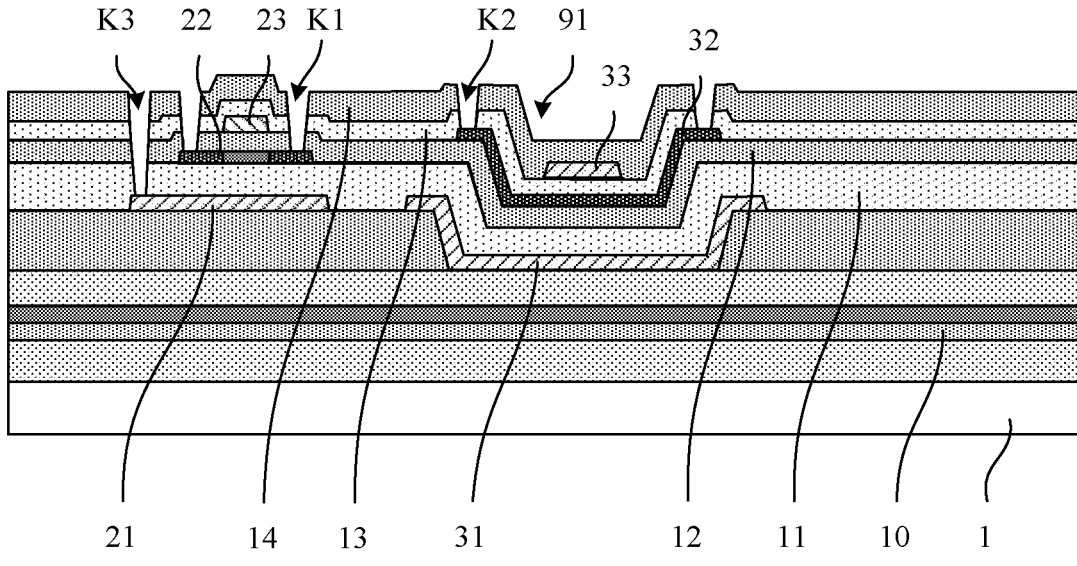
FIG. 13 is a schematic diagram of another display substrate after a pattern of a fourth insulation layer is formed according to the present disclosure.

(A7) A pattern of a fourth insulation layer is formed. In an exemplary implementation mode, forming a pattern of a fourth insulation layer may include: on the base substrate where the aforementioned patterns are formed, depositing a fourth insulation thin film, and patterning the fourth insulation thin film through a patterning process to form a pattern of a fourth insulation layer 14 covering the pattern of the third conductive layer, wherein the fourth insulation layer 14 is provided with multiple vias, and the multiple vias may include: first vias K1 respectively located at both ends of the first active layer 22, second vias K2 respectively located at both ends of the second active layer 32, and a third via K3 located on a side of the first bottom gate electrode 21, as shown in FIG. 13.

In an exemplary implementation mode, the fourth insulation layer 14, the third insulation layer 13, and the second insulation layer 12 in the first vias K1 are etched away to expose surfaces of the source region and the drain region on both sides of the first active layer 22. The first vias K1 may be referred to as low temperature poly silicon (CNT-L) vias. The second vias K2 are located outside the first groove 91, and the fourth insulation layer 14 and the third insulation layer 13 in the second vias K2 are etched away to expose surfaces of the source region and the drain region on both sides of the second active layer 32. The second vias K2 may be referred to as oxide (CNT-O) vias. The fourth insulation layer 14, the third insulation layer 13, the second insulation layer 12, and the first insulation layer 11 in the third via K3 are etched away to expose a surface of the first bottom gate electrode 21. In an exemplary implementation mode, 1.2 times a distance between the source region and the drain region of the second active layer 32 exposed by the second vias K2 may be less than or equal to the width L of the first groove 91 to ensure a shielding effect of the second bottom gate electrode on a channel region of the second active layer.

In an exemplary implementation mode, the fourth insulation layer may be referred to as an Interlayer Dielectric (ILD) layer. The fourth insulation layer may be a stacked layer of SiOx/SiNx, that is, the fourth insulation layer includes a SiOx sub-layer and a SiNx sub-layer, which are stacked, and an overall thickness of the fourth insulation layer may be about 3000 Å to 5000 Å, and a thickness of the SiNx sub-layer is less than or equal to 1.5 times a thickness of the SiOx sub-layer.

In an exemplary implementation mode, since the first bottom gate electrode and the second bottom gate electrode as lower light shielding layers are simultaneously prepared in a same patterning process, a quantity of insulation layers is reduced, thereby reducing a depth difference between a CNT-L via and a CNT-O via, the depth difference between the CNT-L via and the CNT-O via is less than or equal to 2000 Å. A depth of the CNT-L via is about 5000 Å to 9000 Å, which is a total thickness of the second insulation layer, the third insulation layer, and the fourth insulation layer. A depth of the CNT-O via is about 4000 Å to 7000 Å, which is a total thickness of the third insulation layer and the fourth insulation layer. Reducing the depth difference between the CNT-L via and the CNT-O via is beneficial to reduce process requirements of synchronous etching and reduce a process difficulty, so that the CNT-L via and the CNT-O via may be formed simultaneously in a same patterning process, which reduces a quantity of patterning processes, simplifies the processes and saves a production cost.

In an exemplary implementation mode, after the multiple vias are formed, an annealing treatment may be performed, which improves material characteristics of the first active layer and the second active layer through a high temperature annealing process and improves electrical performance of a transistor. After the annealing process, a cleaning treatment may be performed, and an oxide on a surface of the first active layer in a first via may be removed by using a cleaning solution, so as to improve quality of a connection between the first active layer, and a first source electrode and a first drain electrode formed subsequently.

Figure 14:
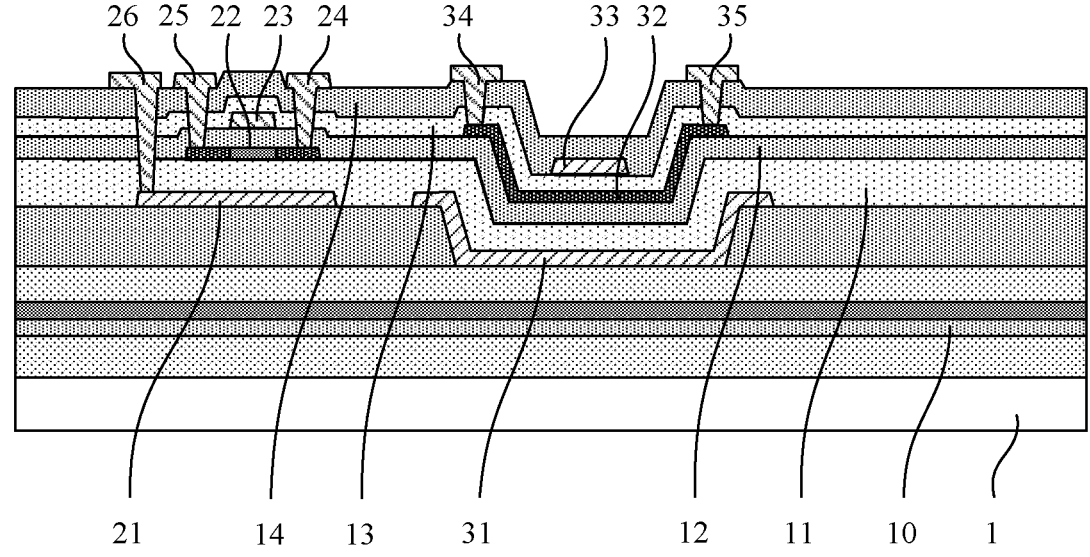
FIG. 14 is a schematic diagram of another display substrate after a pattern of a fourth conductive layer is formed according to the present disclosure.

(A8) A pattern of a fourth conductive layer is formed. In an exemplary implementation mode, forming a pattern of a fourth conductive layer may include: on the base substrate where the aforementioned patterns are formed, depositing a fourth metal thin film, patterning the fourth metal thin film through a patterning process to form a pattern of a fourth conductive layer on the fourth insulation layer 14, wherein the pattern of the fourth conductive layer at least includes a first source electrode 24, a first drain electrode 25, a second source electrode 34, a second drain electrode 35, and a first connection electrode 26, the first source electrode 24 and the first drain electrode 25 are respectively connected with the source region and the drain region of the first active layer 22 through the first vias K1, the first connection electrode 26 is connected with the first bottom gate electrode 21 through the third via K3, and the second source electrode 34 and the second drain electrode 35 are respectively connected with the source region and the drain region of the second active layer 32 through the second vias K2, as shown in FIG. 14.

In an exemplary implementation mode, the fourth conductive layer may be referred to as a first source drain metal layer (SD1). A thickness of the fourth conductive layer may be about 7000 Å to 9000 Å. For example, the thickness of the fourth conductive layer may be about 7500 Å.

In an exemplary implementation mode, the first bottom gate electrode 21, the first active layer 22, the first top gate electrode 23, the first source electrode 24, and the first drain electrode 25 constitute the first transistor 20, wherein the first bottom gate electrode 21 is served both as a lower shielding layer and a bottom gate electrode of the first transistor 20, and the first transistor 20 may be a low temperature poly silicon transistor. The second bottom gate electrode 31, the second active layer 32, the second top gate electrode 33, the second source electrode 34, and the second drain electrode 35 constitute the second transistor 30, wherein the second bottom gate electrode is served as both a lower shielding layer and a bottom gate electrode of the second transistor 30, and the second transistor 30 may be an oxide transistor. In an exemplary implementation mode, the first transistor may be a drive transistor in a pixel drive circuit, and the second transistor may be at least one of multiple switching transistors in the pixel drive circuit. In an exemplary embodiment of the present disclosure, a pixel drive circuit of a display substrate includes at least one low temperature poly silicon transistor and at least one oxide transistor, wherein the preparation process of the exemplary embodiment is used for the at least one oxide transistor.

In an exemplary implementation mode, the first conductive layer, the second conductive layer, third conductive layer, and the fourth conductive layer may be made of a metal material, for example, any one or more of Argentum (Ag), Copper (Cu), aluminum (Al), Titanium (Ti), and Molybdenum (Mo), or an alloy material of the abovementioned metals, for example, an Aluminum-Neodymium alloy (AlNd) or a Molybdenum-Niobium alloy (MoNb), and may be of a single-layer structure, or a multilayer composite structure such as Ti/Al/Ti.

In an exemplary implementation mode, a three-layer composite structure of Ti/Al/Ti may be used for the fourth conductive layer, and an aluminum layer is located between a first titanium layer and a second titanium layer, the first titanium layer is located on a side of the aluminum layer close to the base substrate, and the second titanium layer is located on a side of the aluminum layer away from the base substrate. In an exemplary implementation mode, a thickness of the first titanium layer may be about 600 Å to 800 Å, a thickness of the aluminum layer may be about 5000 Å to 7000 Å, and a thickness of the second titanium layer may be about 400 Å to 600 Å. For example, the thickness of the first titanium layer may be about 700 Å, the thickness of the aluminum layer may be about 6300 Å, and the thickness of the second titanium layer may be about 500 Å

Figure 15:
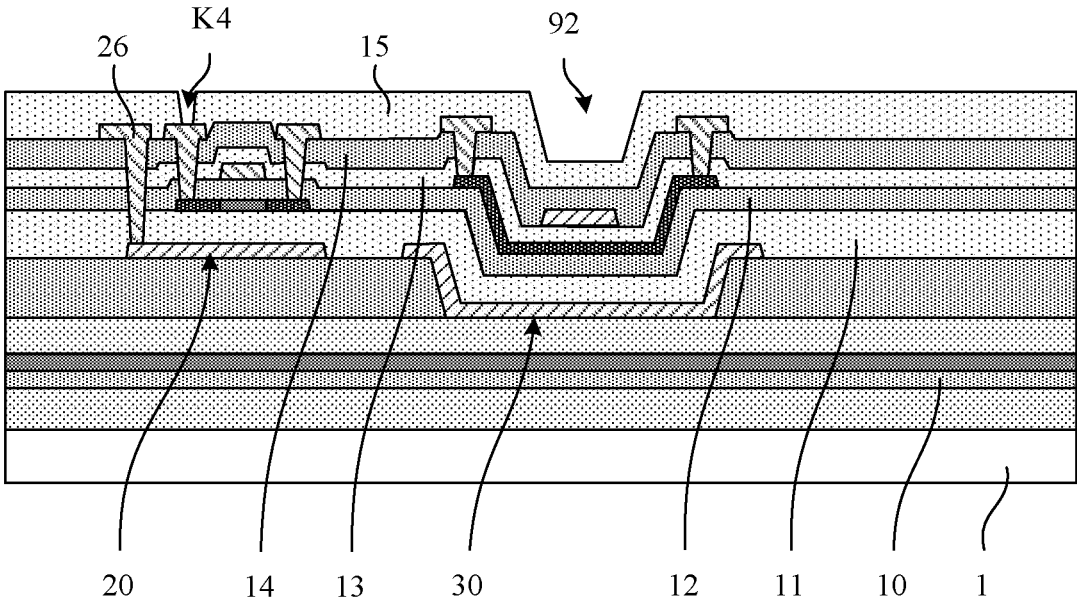
FIG. 15 is a schematic diagram of another display substrate after a pattern of a first planarization layer is formed according to the present disclosure.

(A9) A pattern of a first planarization layer is formed. In an exemplary implementation mode, forming a pattern of a first planarization layer may include: on the base substrate where the aforementioned patterns are formed, coating a first planarization thin film, patterning the first planarization thin film through a patterning process to form a pattern of a first planarization layer 15 covering the pattern of the fourth conductive layer, wherein the first planarization layer 15 is provided with a fourth via K4 and a second groove 92, as shown in FIG. 15.

In an exemplary implementation mode, the first planarization thin film in the fourth via K4 is removed to expose a surface of the first drain electrode of the first transistor 20. A position of the second groove 92 corresponds to a position of the first groove 91, and the first planarization thin film in the second groove 92 is partially removed.

In an exemplary implementation mode, a Passivation (PVX) layer may be provided between the fourth insulation layer and the first planarization layer.

Figure 16:
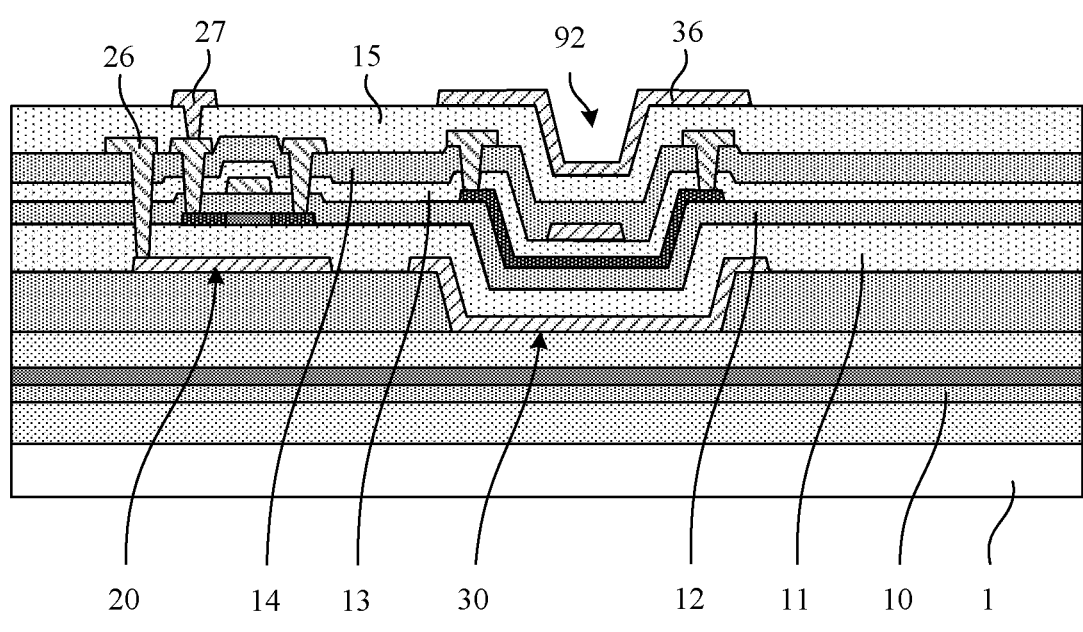
FIG. 16 is a schematic diagram of another display substrate after a pattern of a fifth conductive layer is formed according to the present disclosure.
Figure 17:
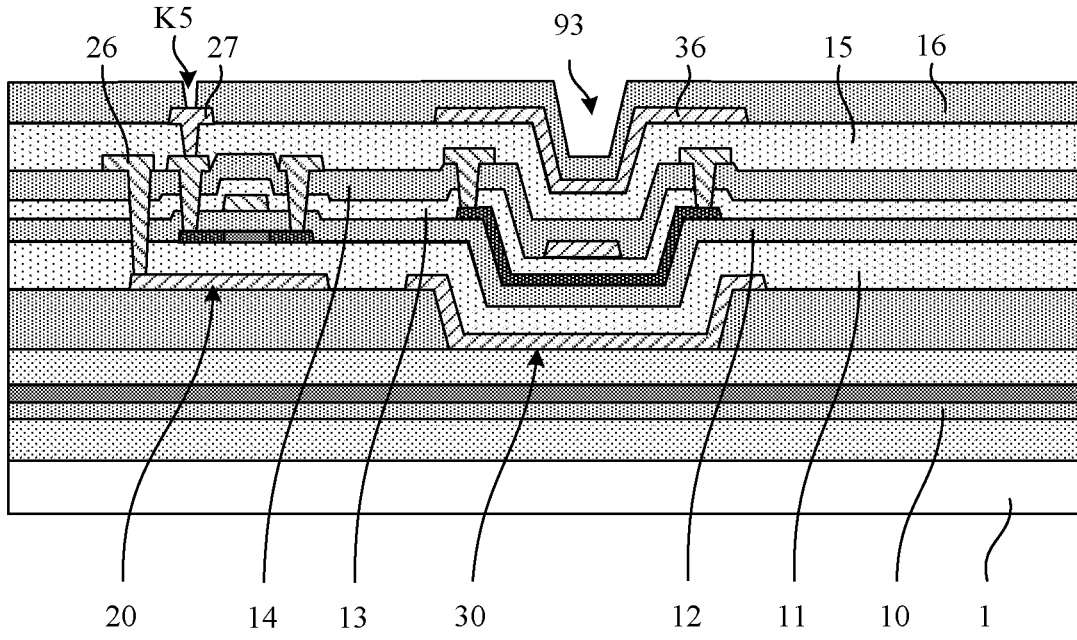
FIG. 17 is a schematic diagram of another display substrate after a pattern of a second planarization layer is formed according to the present disclosure.

(A10) A pattern of a fifth conductive layer is formed. In an exemplary implementation mode, forming a pattern of a fifth conductive layer may include: on the base substrate where the aforementioned patterns are formed, depositing a fifth metal thin film, patterning the fifth metal thin film through a patterning process to a pattern of a fifth conductive layer on the first planarization layer 15, wherein the pattern of the fifth conductive layer at least includes a second connection electrode 27 and a shielding layer 36, the second connection electrode 27 is connected with the first drain electrode of the first transistor 20 through the fourth via K4, a middle region of the shielding layer 36 is disposed in the second groove 92 and an edge region of the shielding layer 36 is disposed on the first planarization layer 15, as shown in FIG. 16.

In an exemplary implementation mode, the shielding layer 36 is served as an upper shielding layer of the second transistor 30 and an orthographic projection of the shielding layer 36 on the base substrate contains an orthographic projection of the second active layer on the base substrate.

In an exemplary implementation mode, the fourth conductive layer may be referred to as a second source drain metal layer (SD2). A thickness of the fifth conductive layer may be about 7000 Å to 9000 Å. For example, the thickness of the fifth conductive layer may be about 7500 Å.

(A11) A pattern of a second planarization layer is formed. In an exemplary implementation mode, forming a pattern of a second planarization layer may include: on the base substrate where the aforementioned patterns are formed, coating a second planarization thin film, patterning the second planarization thin film through a patterning process to form a pattern of a second planarization layer 16 covering the second connection electrode 27, wherein the second planarization layer 16 is provided with a fifth via K5, and a third groove 93, as shown in FIG. 16.

In an exemplary implementation mode, the second planarization thin film in the fifth via K5 is removed to expose a surface of the second connection electrode 27. A position of the third groove 93 corresponds to a position of the second groove 92 and the second planarization thin film in the third groove 93 is partially removed.

Figure 18:
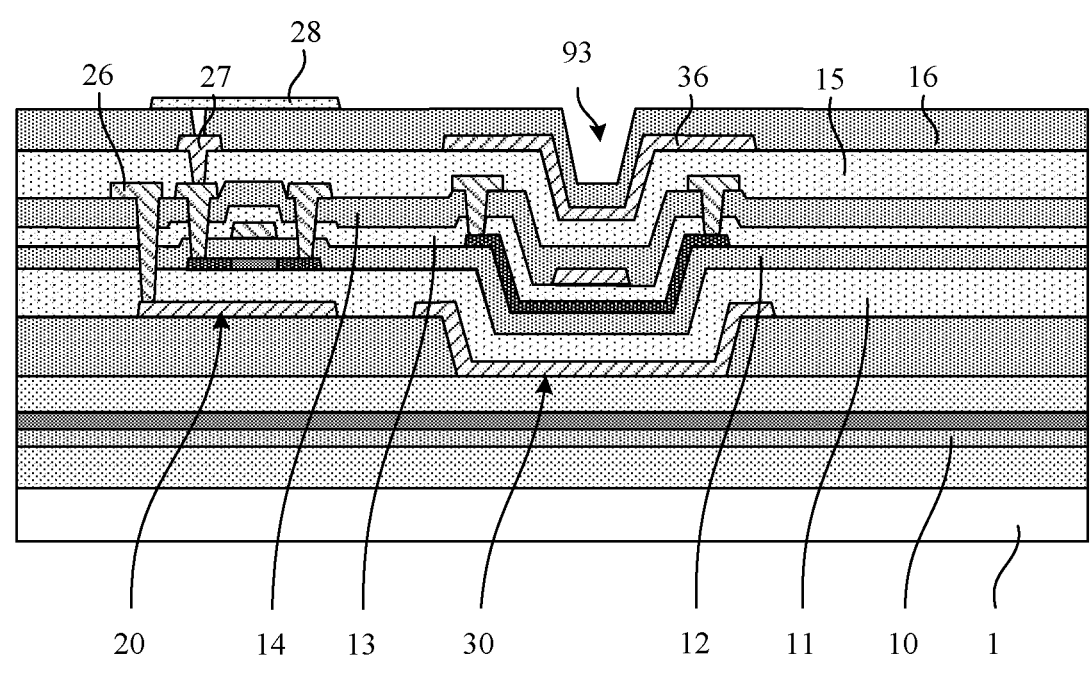
FIG. 18 is a schematic diagram of another display substrate after a pattern of an anode is formed according to the present disclosure.

(A12) A pattern of an anode is formed. In an exemplary implementation mode, forming a pattern of an anode may include: on the base substrate where the aforementioned patterns are formed, depositing a conductive thin film, patterning the conductive thin film through a patterning process to form a pattern of an anode 28 on the second planarization layer 16, wherein the anode 28 is connected with the second connection electrode 27 through the fifth via K5, as shown in FIG. 18.

Preparation of a display substrate according to an exemplary embodiment of the present disclosure may include a process such as sequentially forming a pixel definition layer, an organic light emitting layer, a cathode, and an encapsulating layer, wherein the pixel definition layer is provided with a pixel opening which exposes the anode, the organic light-emitting layer is connected with the anode through the pixel opening, and the cathode is connected with the organic light emitting layer.

In an exemplary implementation mode, the organic light emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL). In an exemplary implementation mode, hole injection layers of all sub-pixels may be connected together to form a common layer, electron injection layers of all the sub-pixels may be connected together to form a common layer, hole transport layers of all the sub-pixels may be connected together to form a common layer, electron transport layers of all the sub-pixels may be connected together to form a common layer, hole block layers of all the sub-pixels may be connected together to form a common layer, emitting layers of adjacent sub-pixels may be overlapped slightly or may be isolated from each other, and electron block layers of adjacent sub-pixels may be overlapped slightly or may be isolated from each other. In an exemplary implementation mode, the encapsulation layer may include a stacked layer structure of a first encapsulation layer, a second encapsulation layer, and a third encapsulation layer. The first encapsulation layer is made of an inorganic material, the second encapsulation layer is made of an organic material, and the third encapsulation layer is made of an inorganic material. The second encapsulation layer is disposed between the first encapsulation layer and the third encapsulation layer, which may ensure external water vapor cannot enter the light emitting structure layer.

In an exemplary implementation mode, the preparation process of the display substrate may further include: stripping the display substrate from the glass carrier plate 1 through a stripping process, attaching a layer of back film to a back surface of the display substrate (a surface of the base substrate 10 on a side away from a film layer) by roller bonding, cutting along a cutting groove by using a cutting device, and the like, which are not limited in the present disclosure.

A display substrate with a conventional structure is formed by 14 patterning processes, and a preparation process of the display substrate includes: (1) forming a first insulation layer and an LTPS active layer on a base substrate; (2) forming a second insulation layer and a first top gate electrode; (3) forming a third insulation layer and a shielding layer; (4) forming a fourth insulation layer and an oxide active layer; (5) forming a fifth insulation layer and a second top gate electrode; (6) forming a sixth insulation layer, on which a low temperature poly silicon (CNT-L) via that exposes the LTPS active layer is formed; (7) forming an oxide (CNT-O) via exposing the oxide active layer on the sixth insulation layer; (8) forming a first drain source electrode and a second drain source electrode; (9) forming a seventh insulation layer, on which a via exposing a first drain electrode is formed; (10) forming a first planarization layer, on which a via exposing the first drain electrode is formed; (11) forming a connection electrode; (12) forming a second planarization layer, on which a via exposing the connection electrode is formed; (13) forming an anode; (14) forming a pixel definition layer and a pillar spacer. In the preparation process, since a depth of the CNT-L via is relatively deep (the depth of the via is about a sum of thicknesses of the second insulation layer, the third insulation layer, the fourth insulation layer, the fifth insulation layer, and the sixth insulation layer), and a depth of the CNT-O via is relatively shallow (the depth of the via is about a sum of thicknesses of the fifth insulation layer and the sixth insulation layer). The CNT-L via and the CNT-O via have a significant difference in depth, so that requirements for synchronizing etching processes are very high and a process difficulty is relatively large. Therefore, the CNT-L Via and the CNT-O Via are formed respectively by using different patterning processes, which not only results in a large number of patterning processes and a high production cost, but also leads to poor performance of a transistor.

According to the display substrate provided by the exemplary embodiment of the present disclosure, the first bottom gate electrode of the first transistor and the second bottom gate electrode of the second transistor are simultaneously prepared in a same patterning process, thus a quantity of insulation layers is reduced, further a depth difference between the CNT-L via and the CNT-O via is reduced, the process difficulty is reduced, so that the CNT-L via and the CNT-O via may be formed simultaneously in a same patterning process, a quantity of patterning processes is reduced, the processes are simplified, and the production cost is saved. By reducing the quantity of insulation layers, not only an overall thickness of the display substrate is effectively reduced, which is conducive to lightening and thinning, but also excessive stress on a back plate caused by too many inorganic film layers may be avoided, which is conducive to flexibility. By reducing the quantity of insulation layers, the first connection electrode may be directly connected with the first bottom gate electrode through a via, instead of adopting a traditional bridging manner in which the first connection electrode is connected with the first bottom gate electrode through the first gate metal layer, thus effectively avoiding defects such as an increased resistance caused by bridging. In addition, in the present disclosure, by arranging a groove in a region where the second transistor is located, not only the overall thickness of the display substrate may be reduced, which is beneficial to lightening and thinning and flexibility, but also a shielding effect is added through the upper shielding layer and the lower shielding layer, thus ensuring electrical performance of the second transistor and improving display quality. In addition, for a bending-type display substrate, by arranging a groove in the region where the second transistor is located, it is conducive to electrical stability of the second active layer during a bending process.

Figure 19:
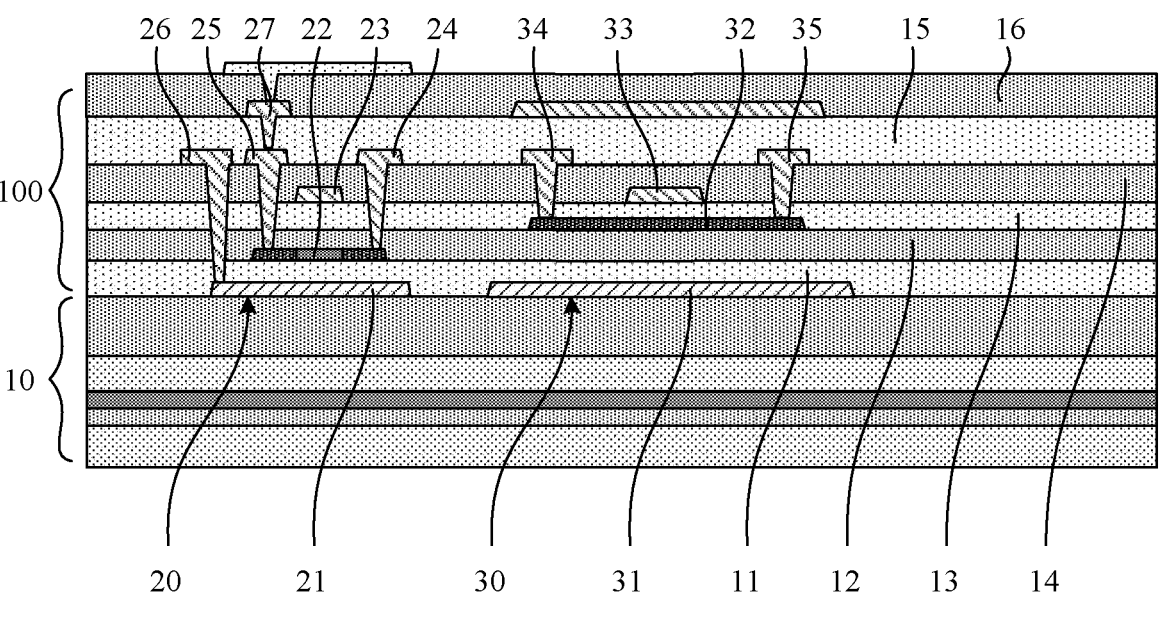
FIG. 19 is a schematic diagram of a structure of yet another display substrate according to an exemplary embodiment of the present disclosure.

FIG. 19 is a schematic diagram of a structure of yet another display substrate according to an exemplary embodiment of the present disclosure. As shown in FIG. 19, the display substrate may include a base substrate 10 and a drive structure layer 100 disposed on the base substrate 10, and the drive structure layer 100 may include a first transistor 20 and a second transistor 30 arranged side by side. The first transistor 20 may include a first bottom gate electrode 21, a first active layer 22, a first top gate electrode 23, a first source electrode 24, and a first drain electrode 25, wherein the first bottom gate electrode 21 simultaneously is served as a shielding layer of the first transistor 20. The second transistor 30 may include a second bottom gate electrode 31, a second active layer 32, a second top gate electrode 33, a second source electrode 34, and a second drain electrode 35, wherein the second bottom gate electrode 31 simultaneously served as a shielding layer of the second transistor 30.

In an exemplary implementation mode, the first bottom gate electrode 21 and the second bottom gate electrode 31 are arranged in a same layer and formed simultaneously through a same patterning process, the first transistor 20 may be a low temperature poly silicon transistor, and the second transistor 30 may be an oxide transistor. Different from the structure shown in FIG. 5, the first top gate electrode 23 and the second top gate electrode 33 of the exemplary embodiment are arranged in a same layer and are formed simultaneously through a same patterning process.

In an exemplary implementation mode, the drive structure layer 100 of the exemplary embodiment may include: a first conductive layer disposed on the base substrate 10, wherein the first conductive layer at least includes a first bottom gate electrode 21 and a second bottom gate electrode 31; a first insulation layer 11 covering the first conductive layer, a first semiconductor layer disposed on the first insulation layer 11, wherein the first semiconductor layer at least includes a first active layer 22; a second insulation layer 12 covering the first semiconductor layer, a second semiconductor layer disposed on the second insulation layer 12, wherein the second semiconductor layer at least includes a second active layer 32; a third insulation layer 13 covering the second semiconductor layer, a third conductive layer disposed on the third insulation layer 13, wherein the third conductive layer at least includes a first top gate electrode 23 and a second top gate electrode 33; a fourth insulation layer 14 covering the third conductive layer, a fourth conductive layer disposed on the fourth insulation layer 14, wherein the fourth conductive layer at least includes a first source electrode 24, a first drain electrode 25, a second source electrode 34, a second drain electrode 35, and a first connection electrode 26, the first source electrode 24 and the first drain electrode 25 are respectively connected with the first active layer 22 through a via, the second source electrode 34 and the second drain electrode 35 are respectively connected with the second active layer 32 through a via, and the first connection electrode 26 is connected with the first bottom gate electrode 21 through a via; a first planarization layer 15 covering the fourth conductive layer, a fifth conductive layer disposed on the first planarization layer 15, wherein the fifth conductive layer at least includes a second connection electrode 27 and s shielding layer 36, the second connection electrode is connected with the first drain electrode 25 through a via, the shielding layer 36 is served as a shielding layer of the second transistor 30, an orthographic projection of the shielding layer 36 on the base substrate contains an orthographic projection of the second active layer 32 on the base substrate; a second planarization layer 16 covering the fifth conductive layer, wherein the second planarization layer 16 is provided with a via which exposes the second connection electrode 27.

Figure 20:
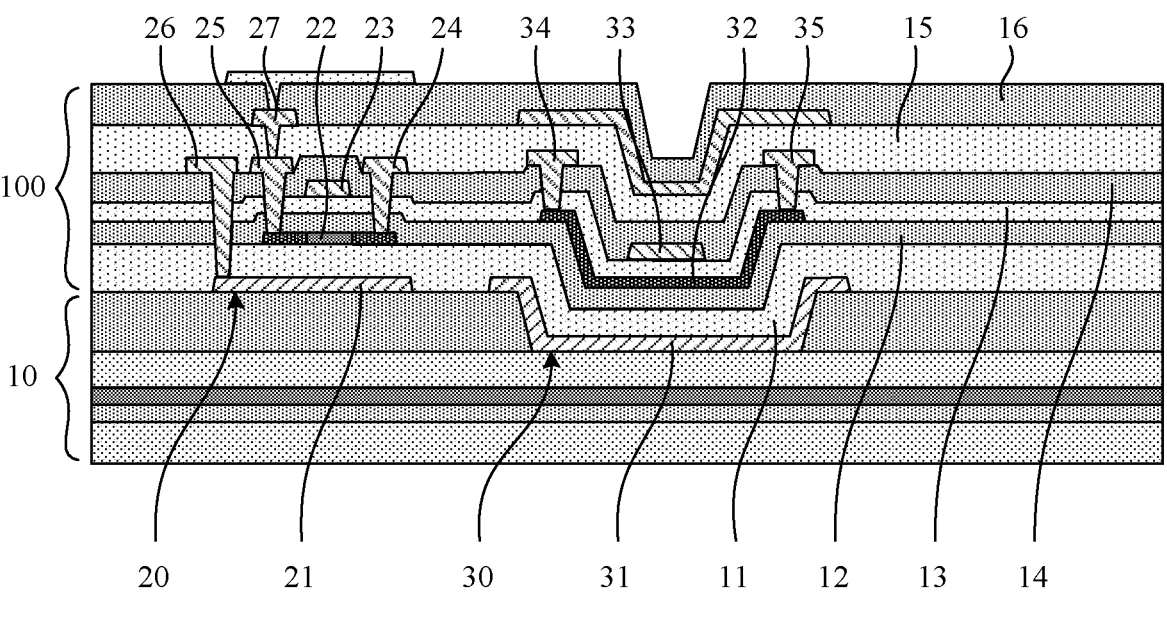
FIG. 20 is a schematic diagram of a structure of yet another display substrate according to an exemplary embodiment of the present disclosure.

FIG. 20 is a schematic diagram of a structure of yet another display substrate according to an exemplary embodiment of the present disclosure. As shown in FIG. 20, the display substrate may include a base substrate 10 and a drive structure layer 100 disposed on the base substrate 10, the drive structure layer 100 includes a first transistor 20 and a second transistor 30 arranged side by side, the first transistor 20 may be a low temperature poly silicon transistor, the second transistor 30 may be an oxide transistor, a first bottom gate electrode 21 of the first transistor 20 and a second bottom gate electrode 31 of the second transistor 30 are arranged in a same layer and formed simultaneously through a same patterning process, a first top gate transistor 23 of the first transistor 20 and a second top gate electrode 33 of the second transistor 30 are arranged in a same layer and formed simultaneously through a same patterning process. Different from the structure shown in FIG. 19, the drive structure layer 100 of the exemplary embodiment is provided with a groove which is disposed in a region where the second transistor 20 is located.

In an exemplary implementation mode, the drive structure layer 100 of the exemplary embodiment may include: a first groove disposed on the base substrate 10, wherein the first groove is disposed in a region where the second transistor 20 is located; a first conductive layer disposed on the base substrate 10, wherein the first conductive layer at least includes a first bottom gate electrode 21 and a second bottom gate electrode 31, a middle region of the second bottom gate electrode 31 is disposed in the first groove; a first insulation layer 11 covering the first conductive layer, a first semiconductor layer disposed on the first insulation layer 11, wherein the first semiconductor layer at least includes a first active layer 22; a second insulation layer 12 covering the first semiconductor layer, a second semiconductor layer disposed on the second insulation layer 12, wherein the second semiconductor layer at least includes a second active layer 32, a middle region of the second active layer 32 is disposed in the first groove; a third insulation layer 13 covering the second semiconductor layer, a third conductive layer disposed on the third insulation layer 13, wherein the third conductive layer at least includes a first top gate electrode 23 and a second top gate electrode 33, the second top gate electrode 33 is disposed in the first groove; a fourth insulation layer 14 covering the third conductive layer, a fourth conductive layer disposed on the fourth insulation layer 14, wherein the fourth conductive layer at least includes a first source electrode 24, a first drain electrode 25, a second source electrode 34, a second drain electrode 35, and a first connection electrode 26, the first source electrode 24 and the first drain electrode 25 are respectively connected with the first active layer 22 through a via, the second source electrode 34 and the second drain electrode 35 are respectively connected with the second active layer 32 through a via, and the first connection electrode 26 is connected with the first bottom gate electrode 21 through a via; a first planarization layer 15 covering the fourth conductive layer, the first planarization layer 15 is provided with a second groove, wherein a position of the second groove corresponds to a position of the first groove; a fifth conductive layer disposed on the first planarization layer 15, wherein the fifth conductive layer at least includes a second connection electrode 27 connected with the first drain electrode 25 through a via and a shielding layer 36, a middle region of the shielding layer 36 is disposed in the second groove as a shielding layer of the second transistor 30, and an orthographic projection of the shielding layer 36 on the base substrate contains an orthographic projection of the second active layer 32 on the base substrate; a second planarization layer 16 covering the fifth conductive layer, wherein the second planarization layer 16 is provided with a via exposing the second connection electrode 27.

Exemplary description is made below through a preparation process of the display substrate according to the exemplary embodiment. FIG. 21 to FIG. 25 are schematic diagrams showing another preparation process of a display substrate. In an exemplary implementation mode, the preparation process of the display substrate according to the exemplary embodiment may include following operations.

(B1) to (B3) A base substrate provided with a first groove is prepared on a glass carrier plate, and patterns of a first conductive layer and a first semiconductor layer are sequentially formed on the base substrate, the preparation process may be the same as the preparation process (A1) to (A3) of the aforementioned embodiment.

Figure 21:
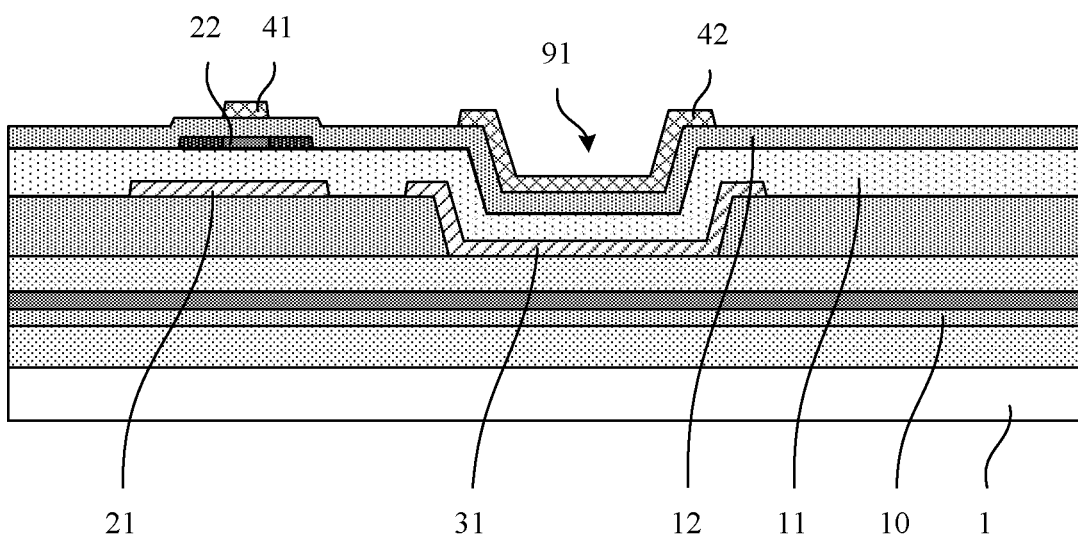
FIG. 21 is a schematic diagram of yet another display substrate after a doping treatment is performed according to the present disclosure.

(B4) A doping treatment is performed on a first active layer. In an exemplary implementation mode, performing a doping treatment on a first active layer may include: on the base substrate where the aforementioned patterns are formed, first depositing a second insulation thin film to form a second insulation layer 12 covering the pattern of the first semiconductor layer, then coating a layer of photoresist on the second insulation thin film, forming a pattern of the photoresist on the second insulation layer 12 by exposing and developing the photoresist, wherein the pattern of the photoresist at least includes a first shielding pattern 41 and a second shielding pattern 42; sequentially, by using the pattern of the photoresist as a shield, performing a doping process on regions on both sides of the first active layer 22 which are not shielded by the first shielding pattern 41, such that a channel if formed in a middle region of the first active layer 22 which is shielded by the first shielding pattern 41, the regions on both sides that are not shielded by the first shielding pattern 41 are processed into doped regions, the doped regions serve as a source region and a drain region of the first active layer 22 respectively, and the source region and the drain region are configured to be connected with a first source electrode and a first drain electrode formed subsequently, as shown in FIG. 21; sequentially, striping the pattern of the photoresist and performing an activation process on the first active layer 22.

In the exemplary implementation mode, a position, a shape, a material, and the like of the first active layer 22 may be the same as those of the aforementioned embodiments.

In an exemplary implementation mode, the first shielding pattern 41 and the second shielding pattern 42 are configured to shield during the doping process. An orthographic projection of the first shielding pattern 41 on the base substrate is located within a range of an orthographic projection of the first active layer 22 on the base substrate, and a position and a shape of the first shielding pattern 41 may be similar to a position and a shape of a first top gate electrode subsequently formed. An orthographic projection of the second shielding pattern 42 on the base substrate is located within a range of an orthographic projection of the second bottom gate electrode 31 on the base substrate, and a position and a shape of the second shielding pattern 42 may be similar to a position and a shape of a second active layer subsequently formed. In an exemplary implementation mode, the second shielding pattern 42 may reduce a quantity of ions in the second insulation layer 12 within its shielding range, so as to reduce a influence of the second insulation layer 12 on the second active layer subsequently formed and improve electrical performance of the second transistor.

Figure 22:
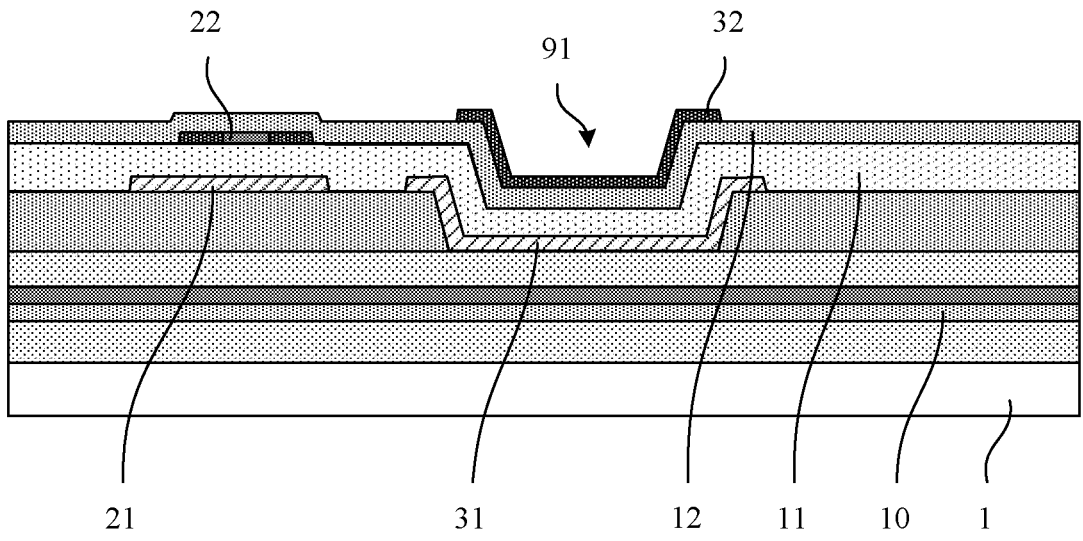
FIG. 22 is a schematic diagram of yet another display substrate after a pattern of a second semiconductor layer is formed according to the present disclosure.

(B5) A pattern of a second semiconductor layer is formed. In an exemplary implementation mode, forming a pattern of a second semiconductor layer may include: on the base substrate on which the aforementioned patterns are formed, depositing a second semiconductor thin film, and patterning the second semiconductor thin film through a patterning process to form a pattern of a second semiconductor layer on the second insulation layer 12, wherein the pattern of the second semiconductor layer at least includes the second active layer 32, as shown in FIG. 22.

In the exemplary implementation mode, a position, a shape, a material, and the like of the second active layer 32 may be the same as those of the aforementioned embodiments.

Figure 23:
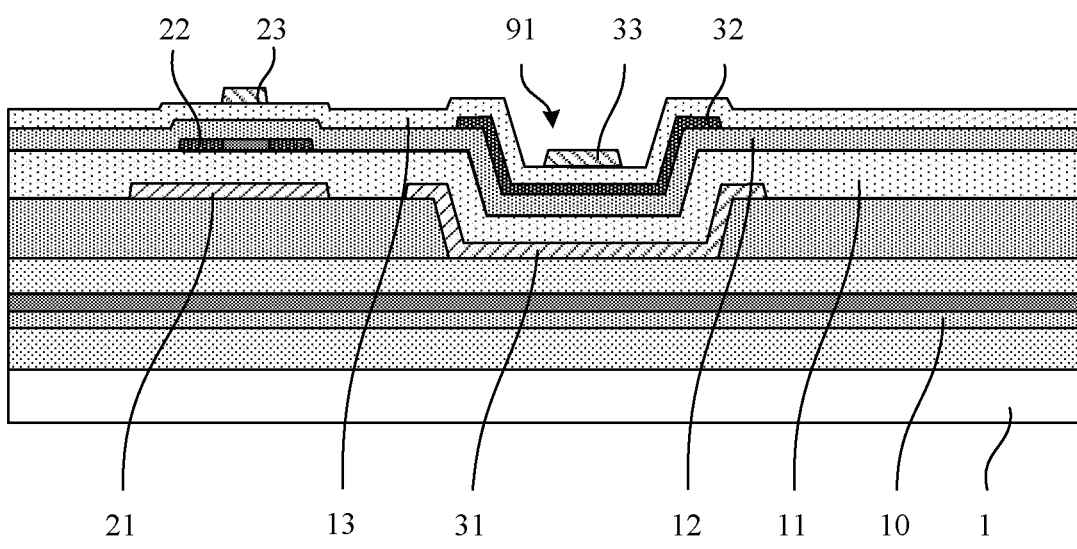
FIG. 23 is a schematic diagram of yet another display substrate after a pattern of a third conductive layer is formed according to the present disclosure.

(B6) A pattern of a third conductive layer is formed. In an exemplary implementation mode, forming a pattern of a third conductive layer may include: on the base substrate where the aforementioned patterns are formed, sequentially depositing a third insulation thin film and a third metal thin film, patterning the third metal thin film through a patterning process to form a third insulation layer 13 covering the pattern of the second active layer, and form a pattern of a third conductive layer disposed on the third insulation layer 13, wherein the pattern of the third conductive layer at least includes a first top gate electrode 23 and a second top gate electrode 33, as shown in FIG. 23.

In an exemplary implementation mode, an orthographic projection of the first top gate electrode 23 on the base substrate is located within a range of an orthographic projection of the first active layer 22 on the base substrate, the second top gate electrode 33 is disposed in a first groove 91, and an orthographic projection of the second top gate electrode 33 on the base substrate is located within a range of an orthographic projection of the second active layer 32 on the base substrate.

In the exemplary implementation mode, a material, a thickness, and the like of the third conductive layer may be the same as those of the aforementioned embodiments.

Figure 24:
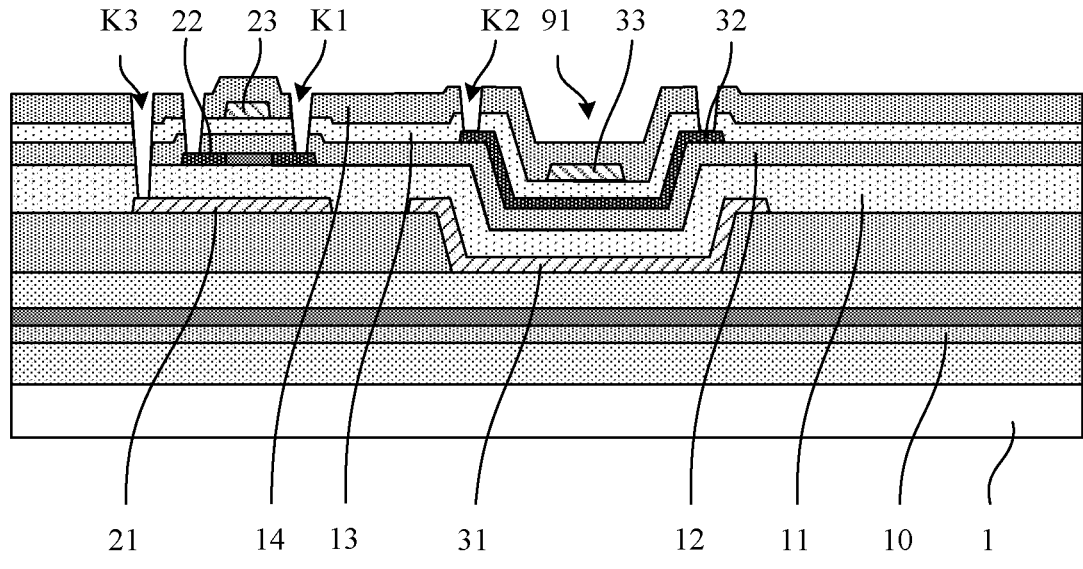
FIG. 24 is a schematic diagram of yet another display substrate after a pattern of a fourth insulation layer is formed according to the present disclosure.

(B7) A pattern of a fourth insulation layer is formed. In an exemplary implementation mode, forming a pattern of a fourth insulation layer may include: on the base substrate where the aforementioned patterns are formed, depositing a fourth insulation thin film, and patterning the fourth insulation thin film through a patterning process to form a pattern of a fourth insulation layer 14 covering the pattern of the second conductive layer, wherein multiple vias are provided on the fourth insulation layer 14, the multiple vias may include: first vias K1 respectively located on both ends of the first active layer 22, second vias K2 respectively located on both ends of the second active layer 32, and a third via K3 located on an end of the first bottom gate electrode 21, as shown in FIG. 24.

In the exemplary implementation mode, a material, a thickness, and the like of the fourth insulation layer may be the same as those of the aforementioned embodiments.

In an exemplary implementation mode, the fourth insulation layer 14, the third insulation layer 13, and the second insulation layer 12 in a first via K1 (CNT-L via) are etched away to expose surfaces of the source region and the drain region on both sides of the first active layer 22. The fourth insulation layer 14 and the third insulation layer 13 in a second via K2 (CNT-O via) are etched away to expose surfaces of the source region and the drain region on both sides of the second active layer 32. The fourth insulation layer 14, the third insulation layer 13, the second insulation layer 12, and the first insulation layer 11 in the third via K3 are etched away to expose a surface of the first bottom gate electrode 21.

In an exemplary implementation mode, since the first bottom gate electrode and the second bottom gate electrode as lower light shielding layers are simultaneously prepared in a same patterning process, the first top gate electrode and the second top gate electrode are simultaneously prepared in a same patterning process, a quantity of insulation layers is reduced, thereby reducing a depth difference between a CNT-L via and a CNT-O via, a depth difference between the CNT-L via and the CNT-O via is less than or equal to 2000 Å. A depth of the CNT-L via is about 5000 Å to 9000 Å, which is a total thickness of the second insulation layer, the third insulation layer, and the fourth insulation layer. A depth of the CNT-O via is about 4000 Å to 7000 Å, which is a total thickness of the third insulation layer and the fourth insulation layer. Reducing the depth difference between the CNT-L via and the CNT-O via is beneficial to reduce requirements for synchronizing etching processes and reduce a process difficulty, so that a CNT-L via and a CNT-O via may be formed simultaneously in a same patterning process, which reduces a quantity of patterning processes, simplifies the processes and saves a production cost.

Figure 25:
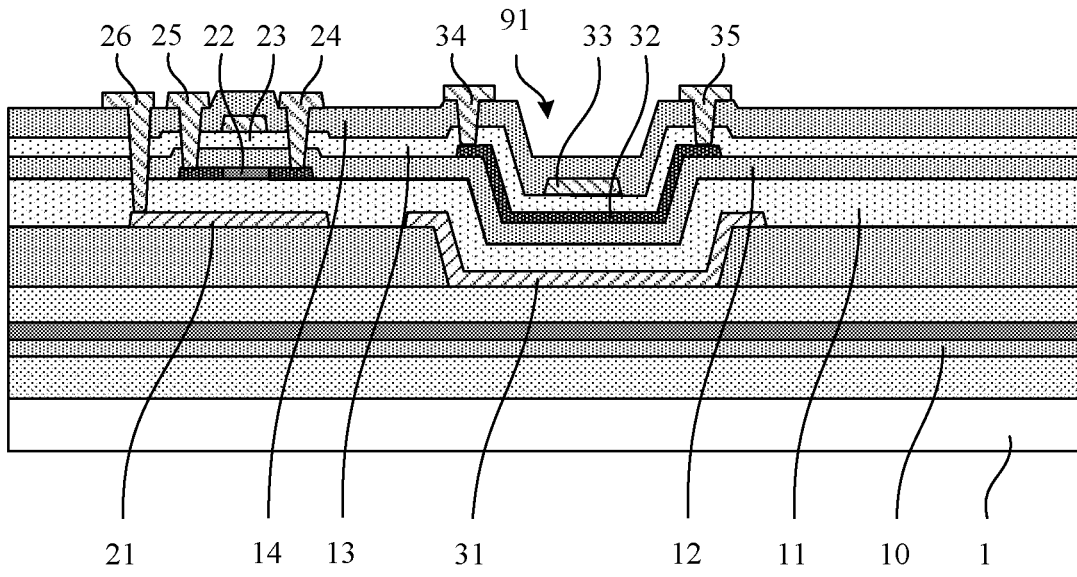
FIG. 25 is a schematic diagram of yet another display substrate after a pattern of a fourth conductive layer is formed according to the present disclosure.

(B8) A pattern of a fourth conductive layer is formed. In an exemplary implementation mode, forming a pattern of a fourth conductive layer may include: on the base substrate where the aforementioned patterns are formed, depositing a fourth metal thin film, patterning the fourth metal thin film through a patterning process to form a pattern of a fourth conductive layer on the fourth insulation layer 14, wherein the pattern of the fourth conductive layer at least includes a first source electrode 24, a first drain electrode 25, a second source electrode 34, a second drain electrode 35, and a first connection electrode 26, the first source electrode 24 and the first drain electrode 25 are respectively connected with the source region and the drain region of the first active layer 22 through the first vias K1, the first connection electrode 26 is connected with the first bottom gate electrode 21 through the third via K3, and the second source electrode 34 and the second drain electrode 35 are respectively connected with the source region and the drain region of the second active layer 32 through the second vias K2, as shown in FIG. 25.

In the exemplary implementation mode, a material, a thickness, and the like of the fourth conductive layer may be the same as those of the aforementioned embodiments.

In an exemplary implementation mode, the first bottom gate electrode 21, the first active layer 22, the first top gate electrode 23, the first source electrode 24, and the first drain electrode 25 constitute the first transistor 20, wherein the first bottom gate electrode 21 is served as both a lower shielding layer and a bottom gate electrode of the first transistor 20, and the first transistor 20 may be a low temperature poly silicon transistor. The second bottom gate electrode 31, the second active layer 32, the second top gate electrode 33, the second source electrode 34, and the second drain electrode 35 constitute the second transistor 30, wherein the second bottom gate electrode is served as both a lower shielding layer and a bottom gate electrode of the second transistor 30, and the second transistor 30 may be an oxide transistor. In an exemplary implementation mode, the first transistor may be a drive transistor in a pixel drive circuit, and the second transistor may be at least one of multiple switching transistors in the pixel drive circuit. In an exemplary embodiment of the present disclosure, the pixel drive circuit of the display substrate includes at least one low temperature poly silicon transistor and at least one oxide transistor, wherein the preparation process of the exemplary embodiment is used for the at least one oxide transistor.

(B9) to (B12) Patterns of a first planarization layer, a fifth conductive layer, a second planarization layer, and an anode are formed, and the preparation process may be the same as the preparation process (A9) to (A12) of the aforementioned embodiment.

In preparation of the display substrate according to the exemplary embodiment of the present disclosure, processes such as forming a pixel definition layer, an organic light emitting layer, a cathode, and an encapsulation layer sequentially may be included and will not be repeated here.

According to the display substrate provided by the exemplary embodiment of the present disclosure, by simultaneously preparing the first bottom gate electrode of the first transistor and the second bottom gate electrode of the second transistor in a same patterning process, and simultaneously preparing the first top gate electrode of the first transistor and the second top gate electrode of the second transistor in a same patterning process, not only a quantity of insulation layers is reduced, a depth difference between a CNT-L via and a CNT-O via is reduced, and a process difficulty is reduced, so that the CNT-L via and the CNT-O via may be formed simultaneously in a same patterning process, but also a quantity of patterning processes is further reduced, the processes are simplified, and a production cost is saved. By reducing the quantity of insulation layers, not only an overall thickness of the display substrate is effectively reduced, which is conducive to lightening and thinning, but also excessive stress on a back plate caused by too many inorganic film layers may be avoided, which is conducive to flexibility. In addition, in the present disclosure, by arranging a groove in a region where the second transistor is located, not only the overall thickness of the display substrate may be reduced, which is beneficial to lightening and thinning and flexibility, but also a shielding effect is added through an upper shielding layer and a lower shielding layer, thus ensuring electrical performance of the second transistor, and improving display quality. In addition, for a bending-type display substrate, by arranging a groove in the region where the second transistor is located, it is conducive to electrical stability of the second active layer during a bending process.

According to the display substrate provided by the exemplary embodiment of the present disclosure, through a reasonable process flow, not only a process difficulty and process requirements are greatly reduced, but also the processes are simplified, a quantity of patterning processes is reduced, and a production cost is saved. The preparation process of the display substrate according to the exemplary embodiment of the present disclosure has simple processes and good process compatibility, which is beneficial to ensuring uniformity of two transistors, improving a yield, and reducing a production cost.

The structure shown in the present disclosure and the preparation process thereof are merely an exemplary description. In an exemplary implementation mode, a corresponding structure may be altered and patterning processes may be increased or reduced according to actual needs. For example, a material of the first active layer may include an oxide, and a material of the second active layer may include low temperature poly silicon. For another example, another electrode or lead may be provided in a related film layer. For yet another example, the pixel drive circuit in the display substrate may be 6T1C, 8T2C, 9T2C, and the like, which is not limited in the present disclosure.

The present disclosure further provides a preparation method of a display substrate. In an exemplary implementation mode, the preparation method may include: forming a drive structure layer on a base substrate, wherein the drive structure layer includes a first transistor and a second transistor arranged side by side, the first transistor includes a low temperature poly silicon transistor, and the second transistor includes an oxide transistor; the first transistor includes a first bottom gate electrode simultaneously served as a shielding layer, and the second transistor includes a second bottom gate electrode simultaneously served as a shielding layer, the first bottom gate electrode and the second bottom gate electrode are arranged in a same layer and simultaneously formed through a same patterning process.

In an exemplary implementation mode, forming a first conductive layer on a base substrate may include following acts.

S1, forming a first conductive layer on a base substrate, wherein the first conductive layer includes a first bottom gate electrode and a second bottom gate electrode, which are arranged in a same layer and simultaneously formed through a same patterning process.

S2, forming an active structure layer on the first conductive layer, wherein the active structure layer includes a first active layer and a first top gate electrode of the first transistor, and a second active layer and a second top gate electrode of the second transistor.

S3, forming a source drain structure layer on the active structure layer, wherein the source drain structure layer includes a first source electrode, a first drain electrode, and a first connection electrode of the first transistor, and a second source electrode and a second drain electrode of the second transistor, the first source electrode and the first drain electrode are connected with the first active layer through a first via, the second source electrode and the second drain electrode are connected with the second active layer through a second via, and the first connection electrode is connected with the first bottom gate electrode through a third via; the first via, the second via, and the third via are formed simultaneously through a same patterning process.

In an exemplary implementation mode, the act S1 may include: forming a base substrate, wherein the base substrate includes a first flexible layer, a first barrier layer, a second flexible layer, and a second barrier layer, which are stacked, a groove is provided on the second barrier layer, and a depth of the groove is greater than 4000 Å; and forming a first conductive layer on the base substrate, wherein the first conductive layer includes a first bottom gate electrode and a second bottom gate electrode which are arranged in a same layer and formed simultaneously through a same patterning process, and at least part of the second bottom gate electrode is disposed in the groove.

In an exemplary implementation mode, the act S2 may include: forming a first insulation layer covering the first conductive layer, and a first active layer of the first transistor disposed on the first insulation layer; forming a second insulation layer covering the first active layer, and a first top gate electrode of the first transistor disposed on the second insulation layer; performing a doping treatment by taking the first top gate electrode as a shield; forming a second active layer of the second transistor on the second insulation layer; and forming a third insulation layer covering the first top gate electrode and the second active layer, and a second top gate electrode of the second transistor disposed on the third insulation layer.

In an exemplary implementation mode, the act S2 may include: forming a first insulation layer covering the first conductive layer, and a first active layer of the first transistor disposed on the first insulation layer; forming a second insulation layer covering the first active layer, and a photoresist shielding pattern disposed on the second insulation layer; performing a doping treatment by taking the photoresist shielding pattern as a shield; forming a second active layer of the second transistor on the second insulation layer; and forming a third insulation layer covering a second semiconductor layer and a first top gate electrode of the first transistor and a second top gate electrode of the second transistor disposed on the third insulation layer.

In an exemplary implementation mode, a depth of the first via is 5000 Å to 9000 Å, and a depth of the second via is 4000 Å to 7000 Å, and a difference between the depth of the first via and the depth of the second via is less than or equal to 2000 Å.

In an exemplary implementation mode, the fourth insulation layer includes a silicon oxide sub-layer and a silicon nitride sub-layer, which are stacked, a thickness of the silicon nitride sub-layer is less than or equal to 1.5 times a thickness of the silicon oxide sub-layer.

In an exemplary implementation mode, a thickness of the first insulation layer is less than or equal to 3 times a thickness of the second insulation layer.

According to the preparation method of the display substrate provided by the exemplary embodiment of the present disclosure, through a reasonable process flow, not only a process difficulty and process requirements are greatly reduced, but also processes are simplified, a quantity of patterning processes is reduced and a production cost is saved. The preparation process of the display substrate according to the exemplary embodiment of the present disclosure has simple processes and good process compatibility, which is beneficial to ensuring uniformity of two transistors, improving a yield, and reducing a production cost.

The present disclosure further provides a display apparatus including the display substrate of the aforementioned embodiments. The display apparatus may be any product or component with a display function, such as a mobile phone, a tablet computer, a television, a display, a laptop computer, a digital photo frame, or a navigator.

Although the implementation modes disclosed in the present disclosure are as above, the described contents are only implementation modes adopted for convenience of understanding the present disclosure and are not intended to limit the present disclosure. Those skilled in the art may make any modification and change to a form and details of implementation without departing from the spirit and scope of the present disclosure. However, the scope of patent protection of the present disclosure should still be subject to the scope defined by the appended claims.

The invention claimed is:

1. A display substrate, comprising a base substrate and a drive structure layer disposed on the base substrate, wherein the drive structure layer comprises a first transistor and a second transistor arranged side by side, the first transistor comprises a low temperature poly silicon transistor, and the second transistor comprises an oxide transistor; the first transistor comprises a first bottom gate electrode simultaneously served as a shielding layer, the second transistor comprises a second bottom gate electrode simultaneously served as a shielding layer, and the first bottom gate electrode and the second bottom gate electrode are arranged in a same layer;

wherein the drive structure layer comprises a first conductive layer disposed on the base substrate, an active structure layer disposed on a side of the first conductive layer away from the base substrate, and a source drain structure layer disposed on a side of the active structure layer away from the base substrate; the first conductive layer comprises the first bottom gate electrode and the second bottom gate electrode arranged in the same layer, the first bottom gate electrode and the second bottom gate electrode are formed simultaneously through a same patterning process; the active structure layer comprises a first active layer of the first transistor and a second active layer of the second transistor;

wherein the source drain structure layer comprises: a fourth insulation layer disposed on a side of the active structure layer away from the base substrate, a source drain metal layer disposed on the fourth insulation layer; the source drain metal layer comprises a first source electrode, a first drain electrode, a second source electrode, a second drain electrode, and a first connection electrode; the first source electrode and the first drain electrode are connected with the first active layer of the first transistor through a first via, the second source electrode and the second drain electrode are connected with the second active layer of the second transistor through a second via, and the first connection electrode is connected with the first bottom gate electrode of the first transistor through a third via;

when the first via, the second via, and the third via are formed, the fourth insulation layer, a third insulation layer, and a second insulation layer in the first via are etched away to expose surfaces of a source region and a drain region on both sides of the first active layer, and the first via is a low temperature poly silicon CNT-L via; the fourth insulation layer and the third insulation layer in the second via are etched away to expose surfaces of a source region and a drain region on both sides of the second active layer, and the second via is an oxide CNT-O via; the fourth insulation layer, the third insulation layer, the second insulation layer, and a first insulation layer in the third via are etched away to expose a surface of the first bottom gate electrode; and the first via, the second via, and the third via are formed simultaneously through a same patterning process.

2. The display substrate according to claim 1, wherein the active structure layer comprises: the first insulation layer covering the first conductive layer, the first active layer of the first transistor disposed on a side of the first insulation layer away from the base substrate, the second insulation layer covering the first active layer, a first top gate electrode of the first transistor disposed on a side of the second insulation layer away from the base substrate, the second active layer of the second transistor disposed on a side of the second insulation layer away from the base substrate, the third insulation layer covering the first gate top electrode and the second active layer, and a second top gate electrode of the second transistor disposed on a side of the third insulation layer away from the base substrate.

3. The display substrate according to claim 1, wherein the active structure layer comprises: the first insulation layer covering the first conductive layer, the first active layer of the first transistor disposed on a side of the first insulation layer away from the base substrate, the second insulation layer covering the first active layer, the second active layer of the second transistor disposed on a side of the second insulation layer away from the base substrate, the third insulation layer covering the second active layer, and a first top gate electrode of the first transistor and a second top gate electrode of the second transistor disposed on a side of the third insulation layer away from the base substrate; the first top gate electrode and the second top gate electrode are arranged in a same layer.

4. The display substrate according to claim 1, wherein a depth of the first via is 5000 Å to 9000 Å, and a depth of the second via is 4000 Å to 7000 Å.

5. The display substrate according to claim 1, wherein a difference between the depth of the first via and the depth of the second via is less than or equal to 2000 Å.

6. The display substrate according to claim 1, wherein the fourth insulation layer comprises a silicon oxide sub-layer and a silicon nitride sub-layer which are stacked, a thickness of the silicon nitride sub-layer is less than or equal to 1.5 times a thickness of the silicon oxide sub-layer.

7. The display substrate according to claim 2, wherein a thickness of the first insulation layer is greater than or equal to 3 times a thickness of the second insulation layer.

8. The display substrate according to claim 1, wherein a groove is provided on the base substrate, at least part of the second bottom gate electrode is disposed in the groove, at least part of the second active layer of the second transistor is disposed in the groove, and a second top gate electrode of the second transistor is disposed in the groove.

9. The display substrate according to claim 8, wherein a depth of the groove is greater than or equal to 4000 Å, and a width of the groove is greater than or equal to 1.2 times a distance between a source region and a drain region of the second active layer in the second transistor.

10. A display apparatus, comprising the display substrate according to claim 1.

11. A preparation method of a display substrate, comprising:

forming a drive structure layer on a base substrate, wherein the drive structure layer comprises a first transistor and a second transistor arranged side by side, the first transistor comprises a low temperature poly silicon transistor, and the second transistor comprises an oxide transistor; the first transistor comprises a first bottom gate electrode simultaneously served as a shielding layer, the second transistor comprises a second bottom gate electrode simultaneously served as a shielding layer, and the first bottom gate electrode and the second bottom gate electrode are arranged in a same layer and simultaneously formed through a same patterning process;

wherein the forming the drive structure layer on the base substrate comprises:

forming a first conductive layer on the base substrate, wherein the first conductive layer comprises the first bottom gate electrode and the second bottom gate electrode, which are arranged in the same layer and simultaneously formed through the same patterning process;

forming an active structure layer on the first conductive layer, wherein the active structure layer comprises a first active layer and a first top gate electrode of the first transistor, and a second active layer and a second top gate electrode of the second transistor; and forming a source drain structure layer on the active structure layer;

wherein the source drain structure layer comprises a first source electrode and a first drain electrode of the first transistor, a first connection electrode, and a second source electrode and a second drain electrode of the second transistor, the first source electrode and the first drain electrode are connected with the first active layer through a first via, the second source electrode and the second drain electrode are connected with the second active layer through a second via, and the first connection electrode is connected with the first bottom gate electrode through a third via;

when the first via, the second via, and the third via are formed, the fourth insulation layer, a third insulation layer, and a second insulation layer in the first via are etched away to expose surfaces of a source region and a drain region on both sides of the first active layer, and the first via is a low temperature poly silicon CNT-L via; the fourth insulation layer and the third insulation layer in the second via are etched away to expose surfaces of a source region and a drain region on both sides of the second active layer, and the second via is an oxide CNT-O via; the fourth insulation layer, the third insulation layer, the second insulation layer, and a first insulation layer in the third via are etched away to expose a surface of the first bottom gate electrode; and the first via, the second via, and the third via are formed simultaneously through a same patterning process.

12. The preparation method according to claim 11, wherein the forming the drive structure layer on the base substrate further comprises:

forming a base substrate, wherein the base substrate comprises a first flexible layer, a first barrier layer, a second flexible layer, and a second barrier layer which are stacked, a groove is provided on the second barrier layer, and a depth of the groove is greater than or equal to 4000 Å;

wherein at least part of the second bottom gate electrode is disposed in the groove.

13. The preparation method according to claim 11, wherein the forming the active structure layer on the first conductive layer comprises:

forming the first insulation layer covering the first conductive layer, and the first active layer of the first transistor disposed on the first insulation layer;

forming the second insulation layer covering the first active layer, and a first top gate electrode of the first transistor disposed on the second insulation layer;

performing a doping treatment by taking the first top gate electrode as a shield;

forming the second active layer of the second transistor on the second insulation layer; and forming the third insulation layer covering the first top gate electrode and the second active layer, and a second top gate electrode of the second transistor disposed on the third insulation layer.

14. The preparation method according to claim 11, wherein the forming the active structure layer on the first conductive layer comprises:

forming the first insulation layer covering the first conductive layer, and the first active layer of the first transistor disposed on the first insulation layer;

forming the second insulation layer covering the first active layer, and a photoresist shielding pattern disposed on the second insulation layer;

performing a doping treatment by taking the photoresist shielding pattern as a shield;

forming the second active layer of the second transistor on the second insulation layer; and forming the third insulation layer covering a second semiconductor layer, and a first top gate electrode of the first transistor and a second top gate electrode of the second transistor disposed on the third insulation layer.

15. The preparation method according to claim 11, wherein a depth of the first via is 5000 Å to 9000 Å, and a depth of the second via is 4000 Å to 7000 Å, and a difference between the depth of the first via and the depth of the second via is less than or equal to 2000 Å.

16. The display substrate according to claim 2, wherein a groove is provided on the base substrate, at least part of the second bottom gate electrode is disposed in the groove, at least part of the second active layer of the second transistor is disposed in the groove, and a second top gate electrode of the second transistor is disposed in the groove.

* * * * *